United States Patent
Satoh

(10) Patent No.: US 7,005,934 B2
(45) Date of Patent: Feb. 28, 2006

(54) CRYSTAL OSCILLATOR WITH TEMPERATURE COMPENSATED THROUGH A VIBRATOR CURRENT CONTROL CIRCUIT

(75) Inventor: Tomio Satoh, Kouza-gun (JP)

(73) Assignee: Toyo Communication Equipment Co., Ltd., Kanagawa (JP)

(*) Notice: Subject to any disclaimer, the term of this patent is extended or adjusted under 35 U.S.C. 154(b) by 6 days.

(21) Appl. No.: 10/727,127

(22) Filed: Dec. 3, 2003

(65) Prior Publication Data

US 2004/0108911 A1    Jun. 10, 2004

(30) Foreign Application Priority Data

Dec. 9, 2002    (JP)    ............................. 2002-357281

(51) Int. Cl.
*H03B 5/32*    (2006.01)
(52) U.S. Cl. ...................... 331/160; 331/176
(58) Field of Classification Search ................ 331/160, 331/176, 158, 116 R, 70, 177 V
See application file for complete search history.

(56) References Cited

U.S. PATENT DOCUMENTS

| | | | | |
|---|---|---|---|---|
| 5,999,062 A | * | 12/1999 | Gilbert | ................... 331/116 R |
| 2002/0050867 A1 | * | 5/2002 | Kato et al. | .............. 331/116 R |
| 2003/0155984 A1 | * | 8/2003 | Kubo et al. | ................. 331/158 |

* cited by examiner

*Primary Examiner*—Joseph Chang
(74) *Attorney, Agent, or Firm*—Koda & Androlia

(57) ABSTRACT

The invention provides a temperature compensated crystal oscillator that can obtain a large variable range and that can obtain high temperature stability. This temperature compensation system employs a configuration comprising a oscillation circuit 12 including a crystal vibrator 11 having a piezoelectric element excited in a given frequency and an oscillation amplifier that excites the piezoelectric element by flowing a current to the piezoelectric element, a vibrator current control circuit 13 that controls the current of the crystal vibrator, a temperature compensation voltage generation circuit 15 that compensates for temperature characteristics of the crystal vibrator 11, and an external variable capacitance diode 17 that changes the oscillation frequency of the oscillation circuit 12 using an external variable voltage controller 16. The vibrator current control circuit 13 comprises a variable capacitance diode 14 that controls the vibrator current, and capacitors 1 to 3.

5 Claims, 16 Drawing Sheets

Fig. 28
Fig. 29
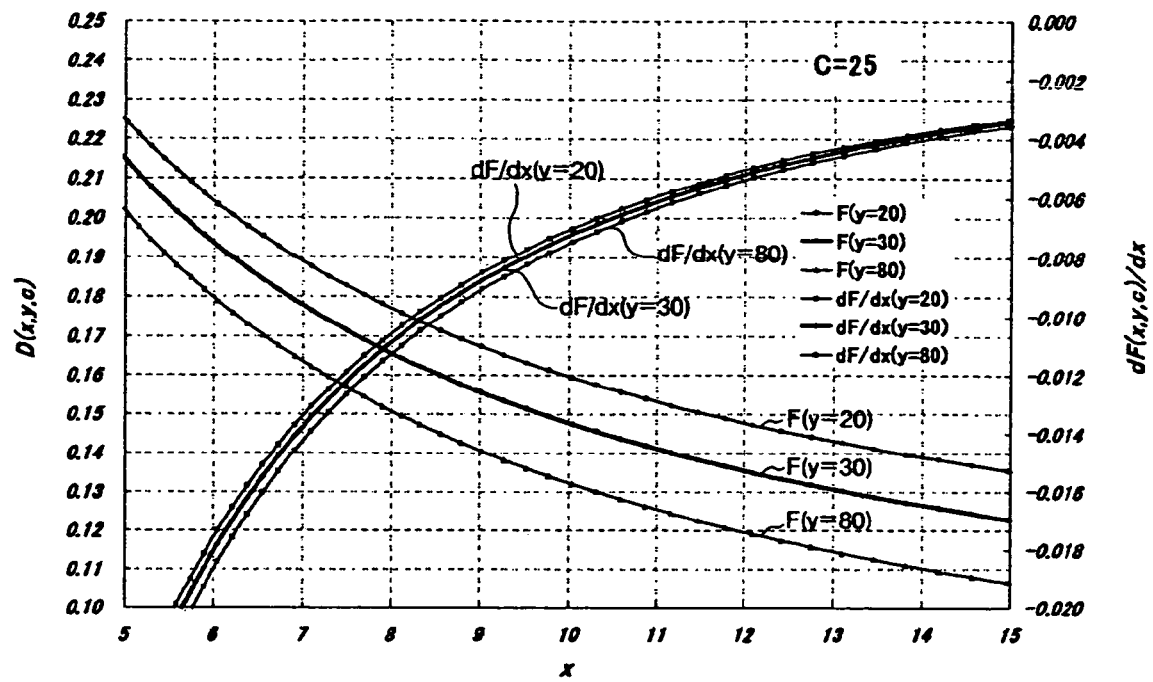
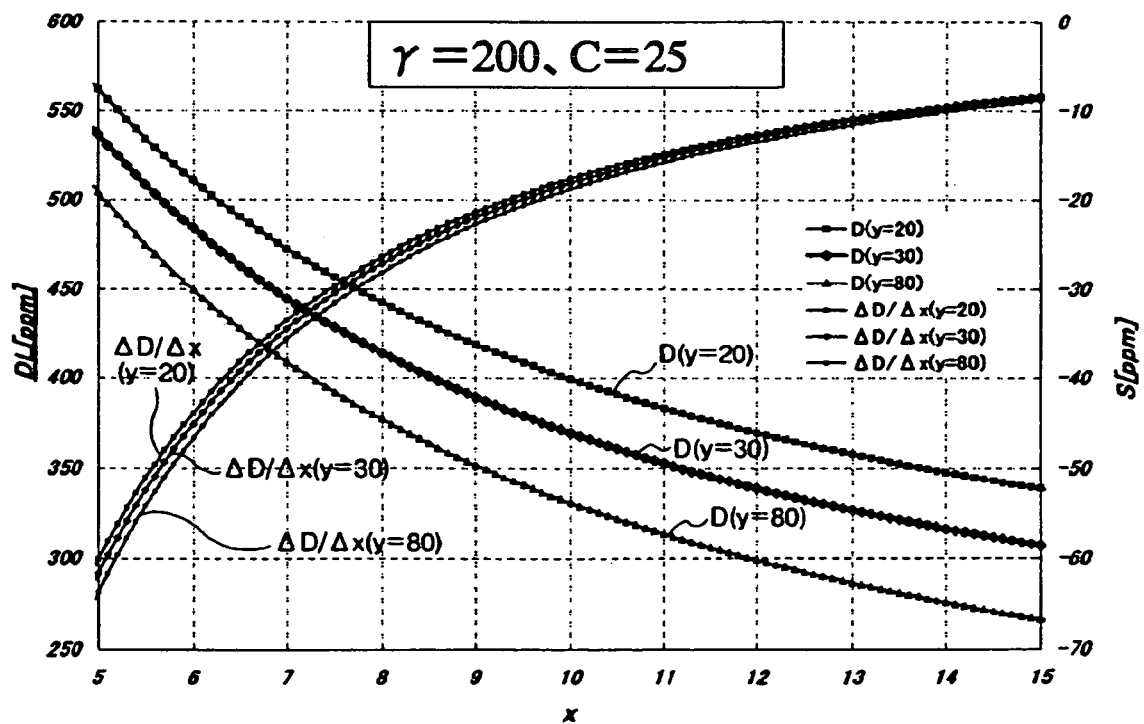

CRYSTAL OSCILLATOR WITH TEMPERATURE COMPENSATED THROUGH A VIBRATOR CURRENT CONTROL CIRCUIT

BACKGROUND OF THE INVENTION

1. Field of the Invention

The present invention relates to a temperature compensated crystal oscillator. Particularly, the present invention relates to a temperature compensation method for a crystal oscillator that is used as a reference frequency in a mobile communication and a satellite communication etc.

2. Description of the Related Art

In recent years, the utilization range of the land mobile communication as represented by portable telephones is expanding steadily. Along this development, the portable telephones are also spreading rapidly, and are involving severe technical development competitions. Crystal oscillators that are used in the portable telephones are also required to have higher performance at low cost in small sizes. The oscillation frequency of the crystal vibrator changes in a cubic curve versus a change in the environmental temperature, as shown in FIG. 23. In order to obtain high stability, an oscillation circuit is provided with a temperature compensation circuit to offset the temperature characteristics of the vibrator. The temperature compensation method is either a direct temperature compensation method or an indirect temperature compensation method. It is general that any one of these method changes the load capacitance of the oscillation circuit thereby to compensate for temperature. The oscillators used in a PLL circuit (phase-locked loop circuit) are required to have a function of changing the frequency by applying a voltage (Vcont) from the outside. An oscillator used in a PLL circuit for a satellite communication is required high stability, therefore, not only Vcont function but also a temperature compensated function (circuit) is provided in the oscillator. In other words, two or more variable functions are provided within the oscillation circuits to change the load capacitance and change the frequency. These functions necessarily interfere with the variable ranges. For example, assume that 100 ppm of the frequency control range is necessary for the temperature compensation circuit. In this case, when 20 ppm of the frequency control range is externally changed by Vcont, a ratio of the load capacitance of the temperature compensation circuit to a total load capacitance changes. Therefore, a frequency change due to the change of the load capacitance changes, which results in 99 ppm of the frequency control range by a temperature compensation circuit, and this aggravates the temperature characteristics by 1 ppm.

FIG. 24 is a block diagram of a conventional temperature compensation type crystal oscillator having an external variable capacitance function (Vcont). A temperature compensation voltage generator 116 generates a compensation functional voltage, and applies the voltage to a variable capacitance diode 114. A load capacitance of the oscillation circuit changes based on a change in the capacitance of the diode. Accordingly, the temperature characteristics of the oscillation frequency of a crystal oscillator 111 are controlled to be flat. Consequently, the frequency temperature characteristics of the oscillator become excellent. In this case, a voltage is input from an external variable controller (Vcont) 117, and is applied to a variable capacitance diode 115 thereby to change the frequency. This not only changes the oscillation frequency but also affects the temperature compensation quantity.

The temperature compensation quantity and the external variable quantity have a strong relationship with a capacitance ratio of the oscillator ($\gamma = C_o/C_1$) as follows.

1. Basic Theory

An equation (1) expresses an offset frequency deviation from a series resonance frequency when the crystal oscillator oscillates.

$$\ldots D_L = \frac{1}{2} \times \frac{C_1}{(C_0 + C_L)} \tag{1}$$

$D_L$: Oscillation frequency deviation
$C_1$: Series capacitance of a vibrator
$C_0$: Parallel capacitance (Inter-electrode capacitance) of a vibrator
$C_c$: Capacitance of a circuit FIG. 25 illustrates an oscillation frequency equivalent block diagram expressed by the equation (1).

FIG. 26 illustrates isolation of the $C_L$ into three series quantities of $C_x$, $C_y$ and $C_c$ as given by an expression (2).

$$\ldots \frac{1}{C_L} = \frac{1}{C_x} + \frac{1}{C_y} + \frac{1}{C_c} \tag{2}$$

For example, $C_x$ represents a temperature compensation quantity, $C_y$ represents a frequency adjustment or an external variable capacitance, and Cc represents an oscillation circuit capacitance. When $C_o = 0$ (Open), the following equation (3) can be obtained.

$$D_L = \frac{C_1}{2C_L} = \frac{C_1}{2}\left(\frac{1}{C_x} + \frac{1}{C_y} + \frac{1}{C_c}\right) = \frac{C_1}{2C_x} + \frac{C_1}{2C_y} + \frac{C_1}{2C_c} \tag{3}$$

As shift quantities of the frequency from the series resonance frequency are added to the capacitances of $C_x$, $C_y$, and $C_c$ respectively, the frequency deviation is not interfered with suppression or the like due to the respective capacitances change.

However, as a piezoelectric element such as the crystal vibrator requires an electrode to promote oscillation, the inter-electrode capacitance $C_o$ cannot be omitted.

The following equation (4) is obtained from the equations (1) and (2).

$$D_L = \frac{C_1}{2(C_0 + C_L)} = \frac{C_1}{2C_0\left(1 + \frac{C_L}{C_0}\right)} \tag{4}$$

$$= \frac{1}{2\gamma\left(1 + \frac{1}{\frac{C_0}{C_L}}\right)} = \frac{1}{2\gamma\left(1 + \frac{1}{\frac{1}{x} + \frac{1}{y} + \frac{1}{c}}\right)}$$

$$= \frac{1}{2\gamma} \times \frac{x + y + \frac{xy}{c}}{x + y + xy + \frac{xy}{c}}$$

$$D_L = \frac{1}{2\gamma} F(x, y, c), \quad \ldots DS_x = \frac{1}{2\gamma} \frac{dF}{dx}$$

$$F(x, y, c) = \frac{x + y + \frac{xy}{c}}{x + y + xy + \frac{xy}{c}}, \quad \ldots S_x = \frac{dF}{dx} \quad (5)$$

$$= \frac{-c^2 y^2}{\{xy + c(x + y + xy)\}^2}$$

$$\gamma = \frac{C_0}{C_1}, \quad \ldots x = \frac{C_x}{C_0}, \, y = \frac{C_y}{C_0}, \, c = \frac{C_c}{C_0} \quad (6)$$

F(x,y,c): A normalization function representing a frequency deviation, when $$\frac{1}{2\gamma} = 1,$$

that is, a capacitance swing=1.

$S_x$: A partially differentiated value of F(x,y,c) repersenting sensitivity of x (i.e., a frequency deviation per unit change).

γ: Capacitance ratio, x: Normalization variable capacitance 1, y: Normalization variable capacitance 2, c: Oscillation circuit capacitance FIG. 27 illustrates a simulation diagram of F(x, y, c) when c=25, y=20, 30, and 80, and x is variable. FIG. 28 is an enlarged diagram of the simulation diagram shown in FIG. 27. From the enlarged diagram, it is clear that sensitivity is high and a change in the normalization frequency deviation is large, in a region where x is small.

FIG. 29 illustrates the frequency deviation DL(x, y, c) and $S_x$ when γ=200, that is, when the capacitance swing ½γ=2500 ppm. FIG. 30 illustrates a frequency deviation based on the DL when x=10. FIG. 31 illustrates a deviation from the DL curve when y=30 and x=10. In other words, FIG. 31 illustrates a difference of the DL relative to a value of x in a curve when y=30 and x=10, and a curve when y=80 and x=10, respectively. In other words, this diagram illustrates a deviation from a reference curve relative to the value of x, that is, interference. As is clear from the diagram, the deviation of each curve becomes larger when the value of x is smaller.

In FIG. 32, the ordinate represents a deviation from the reference curves shown in FIG. 31, and the abscissa represents a frequency deviation when y=30, based on X=10 shown in FIG. 30, that is, a value of the DL. Referring to FIG. 32, when the frequency decreases by 40 ppm in x (variable capacitance 1) and when the frequency increases by 30 ppm in y (variable capacitance 2), a distortion occurs by about 1 ppm. When the frequency decreases by 100 ppm, a distortion occurs by about 2.8 ppm.

The above distortions indicate that it is necessary to take into consideration the additional functions of the oscillator including two variable controllers, that is, addition of a temperature compensation function to an OCXO (high stability oscillator), addition of a temperature compensation function to a VCXO (voltage control oscillator), and addition of a voltage control function to a TCXO (temperature compensation oscillator).

The oscillator having two or more load capacitance variable functions to change the load capacitance of the external control function of frequency and the temperature compensation function as shown in FIG. 24 has a large problem in that mutual variable capacitance distort the variable quantity or the compensation quantity.

The oscillation frequency of the crystal oscillator can be changed according to three elements of load capacitance, environmental temperature, and oscillator current. Among these elements, the change of frequency according to the change in the load capacitance is used most. The high stability oscillator obtains higher stability by making constant the temperatures of the vibrator and the peripheral circuits. However, there is rare example of changing the frequency by using the vibrator current. Only a part of high stability oscillators is provided with a circuit that suppresses the vibrator current in order to improve aging.

SUMMARY OF THE INVENTION

In the present invention, by utilizing the fact that frequency control according to the vibrator current gives substantially no influence to the change of the load capacitance, the vibrator current is controlled to compensate for the frequency temperature characteristics of the crystal oscillator.

In the light of the above problems, it is an object of the present invention to provide a temperature compensated crystal oscillator that can obtain a large variable range and that can obtain high temperature stability that the conventional oscillator having two or more load capacitance variable functions cannot achieve by controlling a vibrator current.

In order to solve the above problems, according to a first aspect of the present invention, there is provided a temperature compensated crystal oscillator comprising: a oscillation circuit that has a piezoelectric vibrator having a piezoelectric element which is excited in a predetermined frequency, and an oscillation amplifier that excites the piezoelectric element by flowing a current to the piezoelectric element; a vibrator current controller that controls a current of the piezoelectric vibrator; a temperature compensation circuit that compensates for temperature characteristics of the piezoelectric vibrator; and a variable capacitance diode that changes the oscillation frequency by changing the load capacitance of the oscillation circuit using an external voltage, wherein the temperature compensation circuit generates a functional voltage that compensates for the temperature characteristics of the piezoelectric vibrator, and inputs the functional voltage to the vibrator current controller, thereby to control the vibrator current to change the oscillation frequency of the oscillation circuit so as to compensate for the temperature characteristics of the piezoelectric vibrator, and the temperature compensation circuit changes an application voltage of the variable capacitance diode by using the external voltage, thereby to change the oscillation frequency of the oscillation circuit.

The conventional oscillator for PLL circuit (phase-locked loop circuit) is required to have two or more variable functions within the oscillation circuits to change the load capacitance and change the frequency. These functions necessarily interfere with the variable ranges. On the other hand, according to the present invention, a variable capacitance diode is used in which the temperature compensation circuit generates a functional voltage to control the vibrator current, thereby to change the oscillation frequency of the oscillation circuit so as to compensate for the temperature characteristics of the piezoelectric vibrator, and the temperature compensation circuit changes an application voltage of the variable capacitance diode using the external voltage, thereby to change the oscillation frequency of the oscillation circuit by changing the load capacitance of the oscillation circuit.

According to the above aspect of the invention, the vibrator current is controlled to compensate for the temperature characteristics. Therefore, an oscillator having two or more load capacitance variable functions can obtain a large variable range, and at the same time, can obtain high temperature stability without interfering with the mutual variable ranges.

According to a second aspect of the invention, there is provided a temperature compensated crystal oscillator comprising: a oscillation circuit that has a piezoelectric vibrator having a piezoelectric element which is excited in a predetermined frequency, and an oscillation amplifier that excites the piezoelectric element by flowing a current to the piezoelectric element; a vibrator current controller that controls a current of the piezoelectric vibrator; a temperature compensation circuit that compensates for temperature characteristics of the piezoelectric vibrator; and a variable capacitance diode that changes the oscillation frequency by changing the load capacitance of the oscillation circuit using an external voltage, wherein the temperature compensation circuit generates a functional voltage that compensates for the temperature characteristics of the piezoelectric vibrator, and applies the functional voltage to the variable capacitance diode to change the load capacitance of the oscillation circuit, thereby to change the oscillation frequency of the oscillation circuit so as to compensate for the temperature characteristics of the piezoelectric vibrator, and the temperature compensation circuit changes a voltage to be input to the vibrator current controller using the external voltage, thereby to change the oscillation frequency of the oscillation circuit.

According to the first aspect of the invention, the temperature compensation circuit that compensates for temperature characteristics is connected to the vibrator current controller thereby to compensate for temperature. On the other hand, according to the present aspect, a functional voltage generated by the temperature compensation circuit is applied to the variable capacitance diode, thereby to change the oscillation frequency and compensate for temperature. An external voltage is applied to the vibrator current controller to change the frequency.

According to the present aspect, operation effects similar to those according to the first aspect of the invention can be obtained.

According to a third aspect of the invention, a reactance element that changes the oscillation frequency of the oscillation circuit by changing the load capacitance is further inserted into the load of the oscillation circuit.

When the load capacitance of the oscillation circuit changes, a slope of the frequency deviation at the time of application of a temperature compensation voltage changes. In other words, when the load capacitance is changed, the oscillation frequency can be changed.

According to the present aspect, as the reactance element that changes the oscillation frequency is further inserted, the oscillation frequency can be changed in a simple circuit configuration.

According to a fourth aspect of the invention, a variable reactance element that changes the oscillation frequency of the oscillation circuit by changing the load capacitance is further inserted into the load of the oscillation circuit, and the capacitance of the variable reactance element is changed from the outside of the oscillator thereby to control the oscillation frequency of the oscillation circuit.

When the capacitance of the reactance element can be changed optionally like a variable trimmer, the oscillation frequency can be controlled by externally changing the trimmer.

According to the present aspect, the variable reactance element is used that can optionally change the reactance element like the variable trimmer. Therefore, the oscillation frequency can be easily controlled externally.

According to a fifth aspect of the invention, the temperature compensated crystal oscillator further comprises a correction variable capacitance diode that corrects a compensation distortion generated by changing the load capacitance, wherein the correction variable capacitance diode corrects a compensation distortion generated by changing the load capacitance of the vibrator current controller using a functional voltage that is generated by the temperature compensation circuit.

According to the present aspect, the vibrator current controller comprises the correction variable capacitance diode. Therefore, it is possible to correct for the compensation distortion generated by changing the load capacitance, thereby to further decrease the frequency distortion relative to the application voltage.

BRIEF DESCRIPTION OF THE DRAWINGS

FIG. 28 is an enlarged diagram of the simulation diagram of F(x, y, c) and $S_x$;

FIG. 29 illustrates a simulation diagram of D(x, y, c) and $S_x$;

DETAILED DESCRIPTIONS

Embodiments according to the present invention will be explained in detail with reference to the drawings. Unless specified otherwise, configuration elements, kinds, combinations, shapes, and their relative positions that are described in the embodiments do not limit the range of the present invention, and they are simple explanatory examples.

In general, stress and distortion of crystal of a crystal vibrator have a nonlinear relationship. Therefore, it is confirmed that the resonance frequency changes as follows according to the vibrator current.

$$\ldots \frac{\Delta f}{f} = K i^2$$

i: Vibrator current
K: Proper constant determined by cut, vibration mode, electrode size, etc.

As a method for controlling the vibrator current at the oscillation time, an AGC circuit is added to a part of high stability crystal oscillators (OCXO) to improve the aging. However, this method involves complexity in the circuit and is not practical.

In the present example, a circuit described in Japanese Patent Application No. 2002-265000 by the same applicant is used. A temperature compensation simulation is carried out utilizing a fact that the vibrator current can be controlled.

Figure 1:
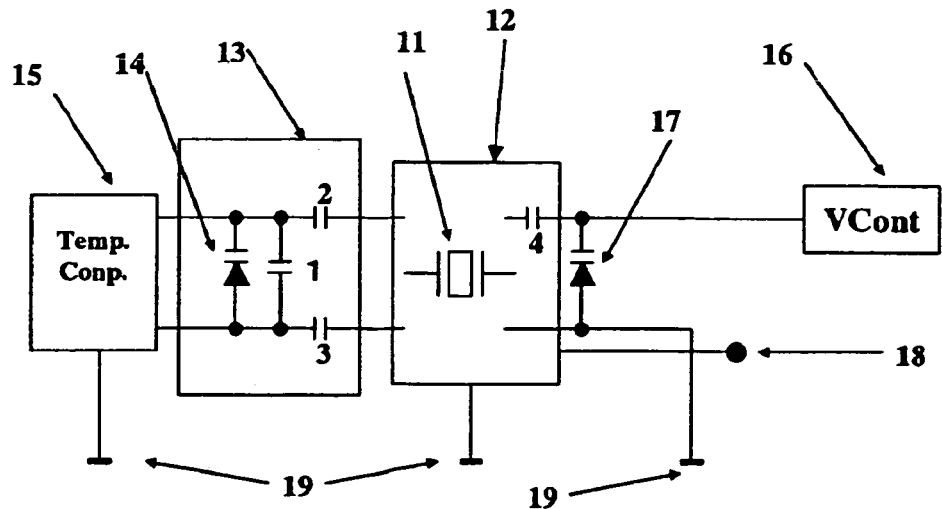
FIG. 1 is a block diagram of a temperature compensation system according to the present invention.

FIG. 1 is a block diagram of a temperature compensation method according to the present invention. This temperature compensation method employs a configuration comprising a oscillation circuit 12 including a crystal vibrator 11 having a piezoelectric element excited in a given frequency and an oscillation amplifier not shown that excites the piezoelectric element by flowing a current to the piezoelectric element, a vibrator current control circuit 13 that controls the current of the crystal vibrator 11, a temperature compensation voltage generation circuit 15 that compensates for temperature characteristics of the crystal vibrator 11, and an external variable capacitance diode 17 that changes the oscillation frequency of the oscillation circuit 12 using an external variable voltage controller 16. The vibrator current control circuit 13 comprises a variable capacitance diode 14 that controls the vibrator current, and capacitors 1 to 3.

The outline operation of the configuration shown in this block diagram is as follows. The temperature compensation voltage generation circuit 15 generates a functional voltage that compensates for the temperature characteristics of the crystal vibrator 11, and applies this functional voltage to the vibrator current control circuit 13. The vibrator current control circuit 13 controls the vibrator current of the crystal vibrator 11, thereby to change the oscillation frequency of the oscillation circuit 12 so as to compensate for the temperature characteristics of the crystal vibrator 11.

Figure 2:
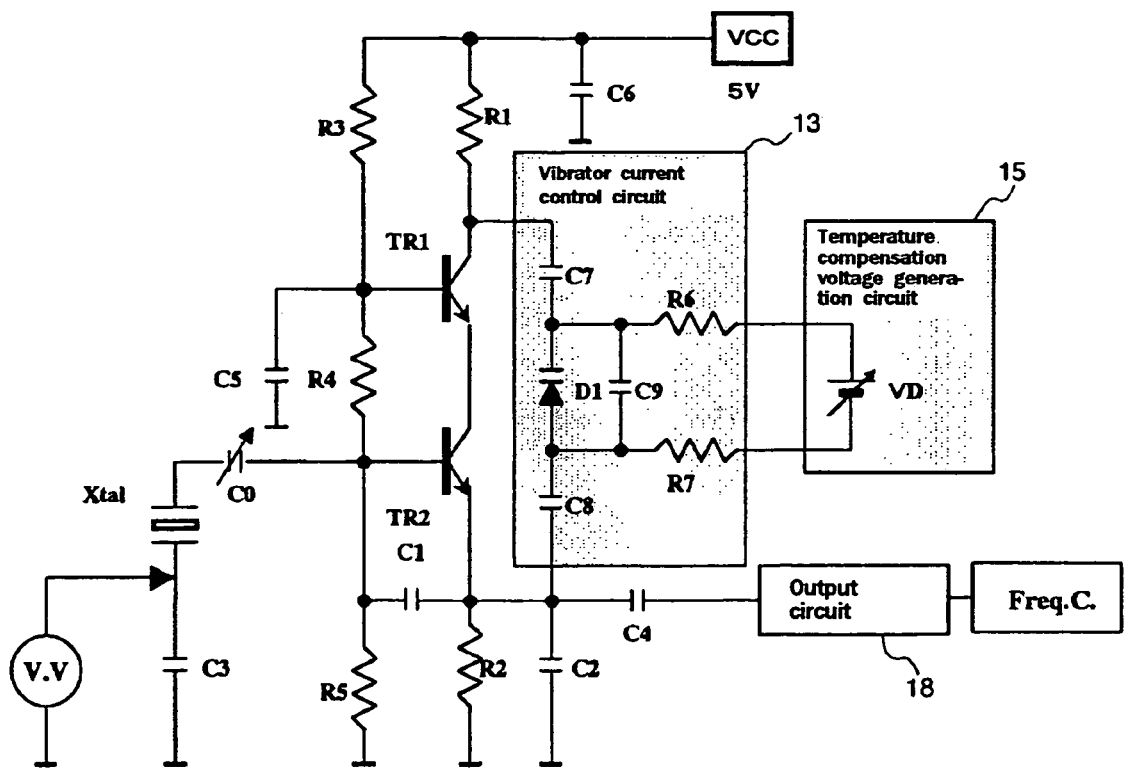
FIG. 2 illustrates a circuit diagram to exemplify the temperature compensation system according to the present invention.

FIG. 2 illustrates a circuit diagram to exemplify the temperature compensation system. Like constituent elements are designated with like reference numerals, and duplicated explanations will be omitted. Constants are set as follows.

R1=390Ω, R2=1 kΩ, R3/R4=10 kΩ, R5=20 kΩ, R6/R7=100 kΩ, $C_o$=Variable, C1/C2=27 pF, C3=100 pF, C4=10 pF, C5/C6=10000 pF, C7=0 pF, C8/C9=0.1 μF, TR1/TR2=2SC3732, D1=MA2S304, Xtal=26 MHz·At-Cut1st, VCC=5 Vdc, VD=DC power supply, V.V=High frequency voltmeter, and Freq.C.=Frequency counter.

The oscillation circuit is a Colpitts oscillator circuit in cascade connection. The Colpitts oscillator circuit supplies an oscillation output to the vibrator current control circuit 13 that is inserted and connected between the collector of the transistor TR1 and the emitter of the transistor TR2. The temperature compensation voltage generation circuit 15 is connected to the vibrator current control circuit 13 via the resistors R6 and R7, thereby to supply a functional voltage.

Figure 3:
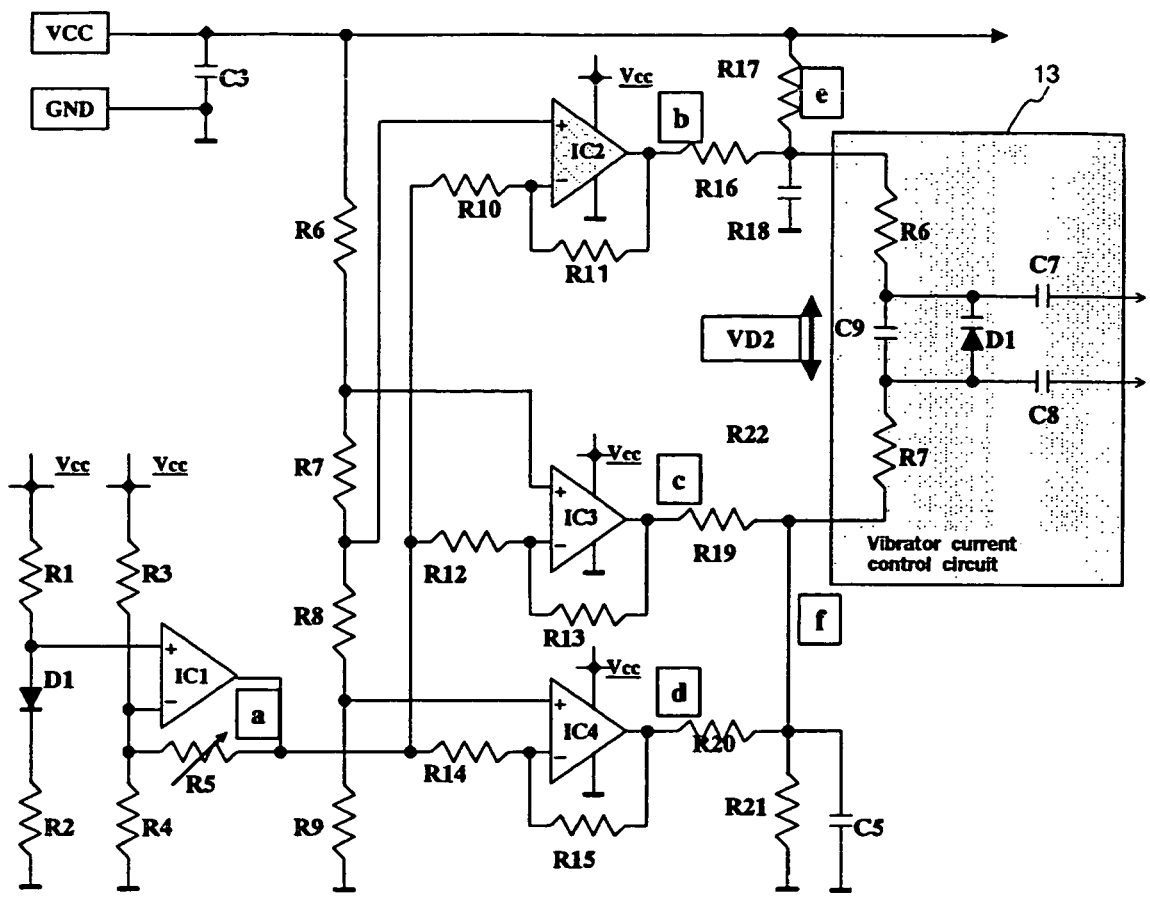
FIG. 3 illustrates a circuit diagram of a compensation voltage generation circuit to exemplify the temperature compensation system according to the present invention.

FIG. 3 illustrates a circuit diagram of the temperature compensation voltage generation circuit 15 and a circuit diagram of the vibrator current control circuit 13 according to the present invention. Like constituent elements are designated with like reference numerals, and duplicated explanations will be omitted. Constants at the time of the simulation of the temperature compensation voltage generation circuit 15 are given as follows.

R1·3·4=10 kΩ, R2=6.5 kΩ, R5=Variable adjustment, D1=1S953, IC1=TC75S51FU

Figure 4:
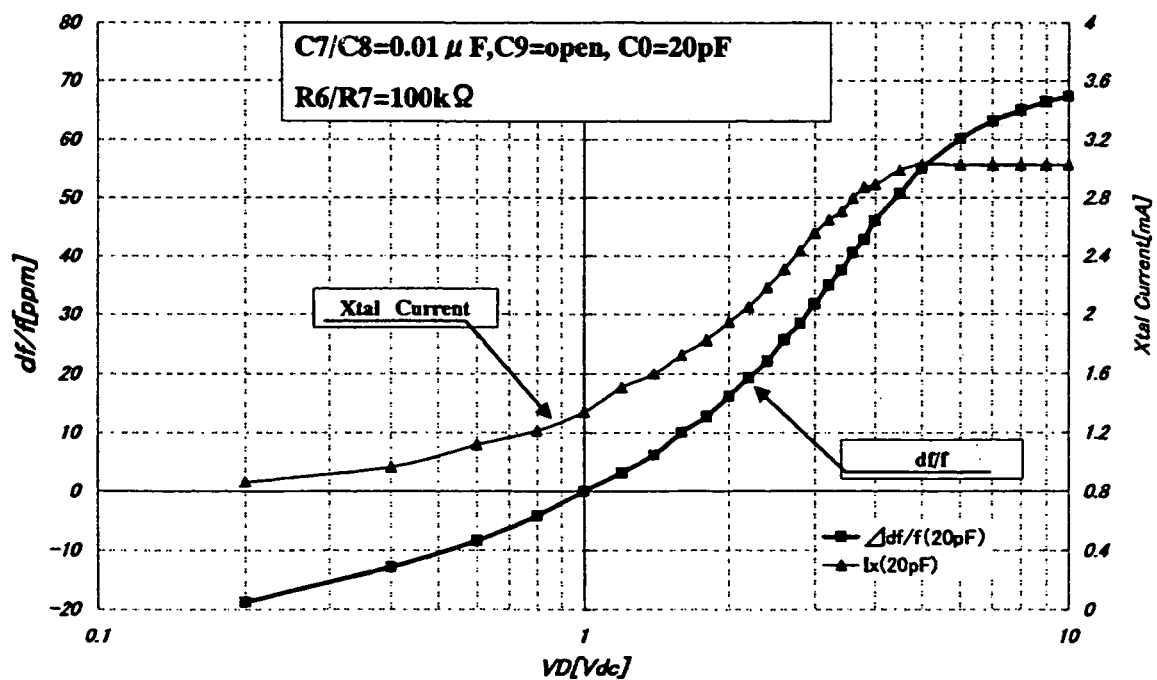
FIG. 4 illustrates a circuit example 1 expressing a relationship between D1 application voltage and frequency deviation and vibrator current according to the present invention.

R10=10 kΩ, R11=30 kΩ, IC2=TC75S51FU
R12=10 kΩ, R13=140 kΩ, IC3=TC75S51FU
R14=10 kΩ, R15=140 kΩ, IC4=TC75S51FU
R6=9.6 kΩ, R7=11.1 kΩ, R8=11.3 kΩ, R9=8 kΩ,
R16·17·18·21·22=100 kΩ, R19·20=200 kΩ, D2=MA2S304, C3·4·5=0.1 μF
Xtal=13 MHz, γ=240, $C_o$=1.35 pF, Cp=40 pF,Cs=35 pF
Vcc=3.0V, FIG. 4 illustrates a relationship between D1 application voltage and frequency deviation and vibrator current, where the capacitance $C_o$=20 pF, and the voltage applied to the variable capacitance diode D1 is changed by changing the voltage of the variable diode VD. The ordinate expresses a deviation based on the frequency when VD=1V, and the abscissa expresses a voltage applied to the variable diode VD and the variable capacitance diode D1.

Figure 5:
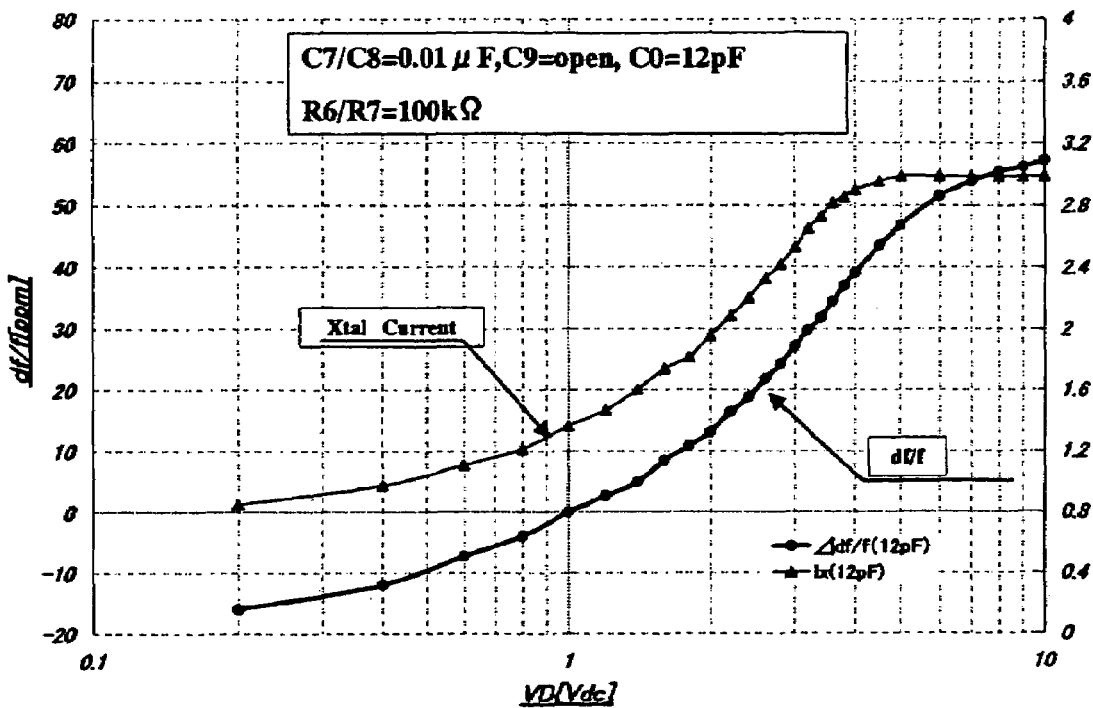
FIG. 5 illustrates a circuit example 2 expressing a relationship between D1 application voltage and frequency deviation and vibrator current according to the present invention.
Figure 6:
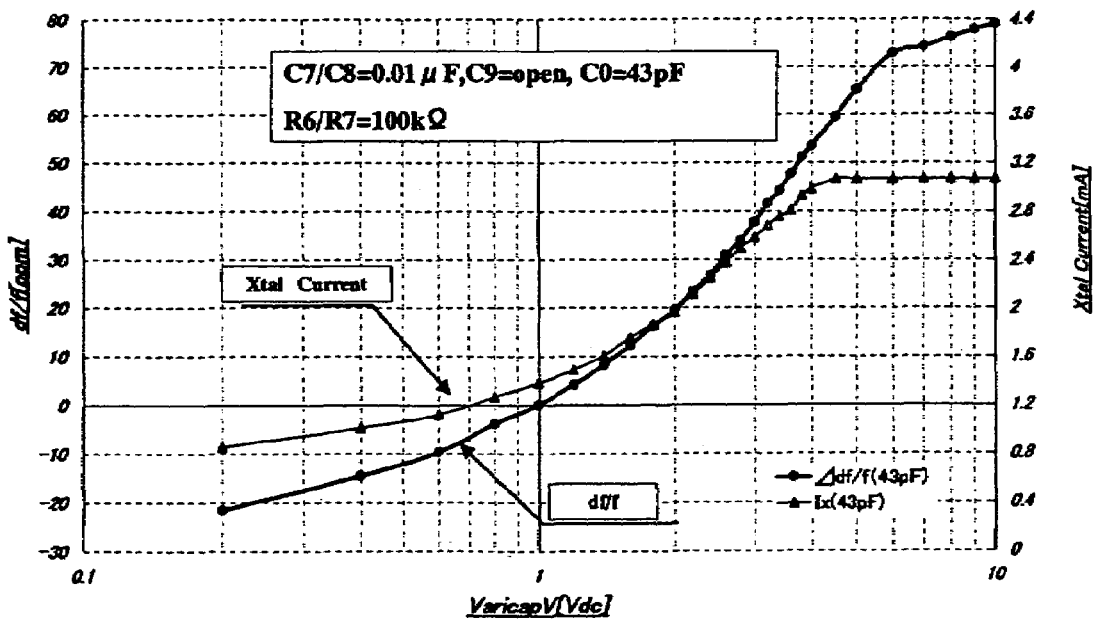
FIG. 6 illustrates a circuit example 3 expressing a relationship between D1 application voltage and frequency deviation and vibrator current according to the present invention.

Similarly, FIG. 5 shows a result when the capacitance $C_o$=12 pF, and FIG. 6 shows a result when the capacitance $C_o$=43 pF. From these diagrams, it is clear that the oscillation frequency and the vibrator current show similar changes relative to the applied voltage to D1.

The vibrator current is obtained from the following expression (7).

$$I_X(\text{Xtal Current}) = \omega CV \quad (7)$$

Figure 7:
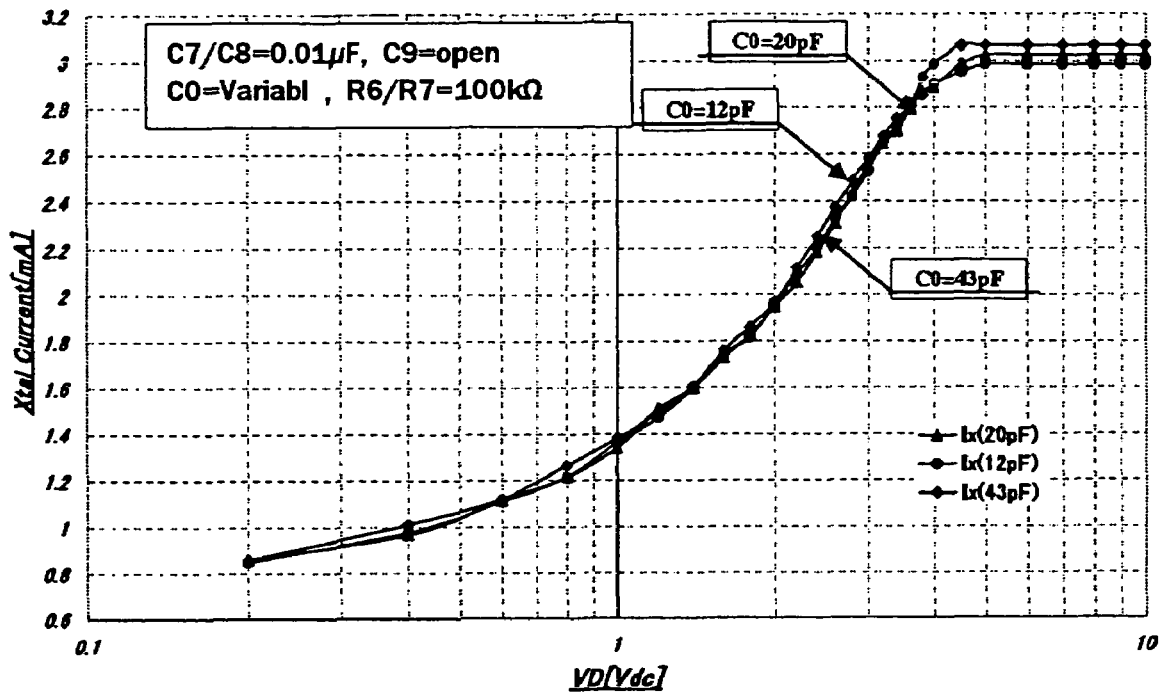
FIG. 7 illustrates a circuit example 4 expressing a relationship between D1 application voltage and vibrator current according to the present invention.

V: Voltage at both ends of $C_3$: VV unit rms
C: Capacitance of $C_3$:100 pF
ω=2πf f=26 MHz FIG. 7 illustrates a change in the vibrator current having each $C_o$ as a parameter relative to a change in the voltage of the VD. As shown in FIG. 7, it is clear that the change in the vibrator current does not substantially depend on the value of $C_o$.

Figure 8:
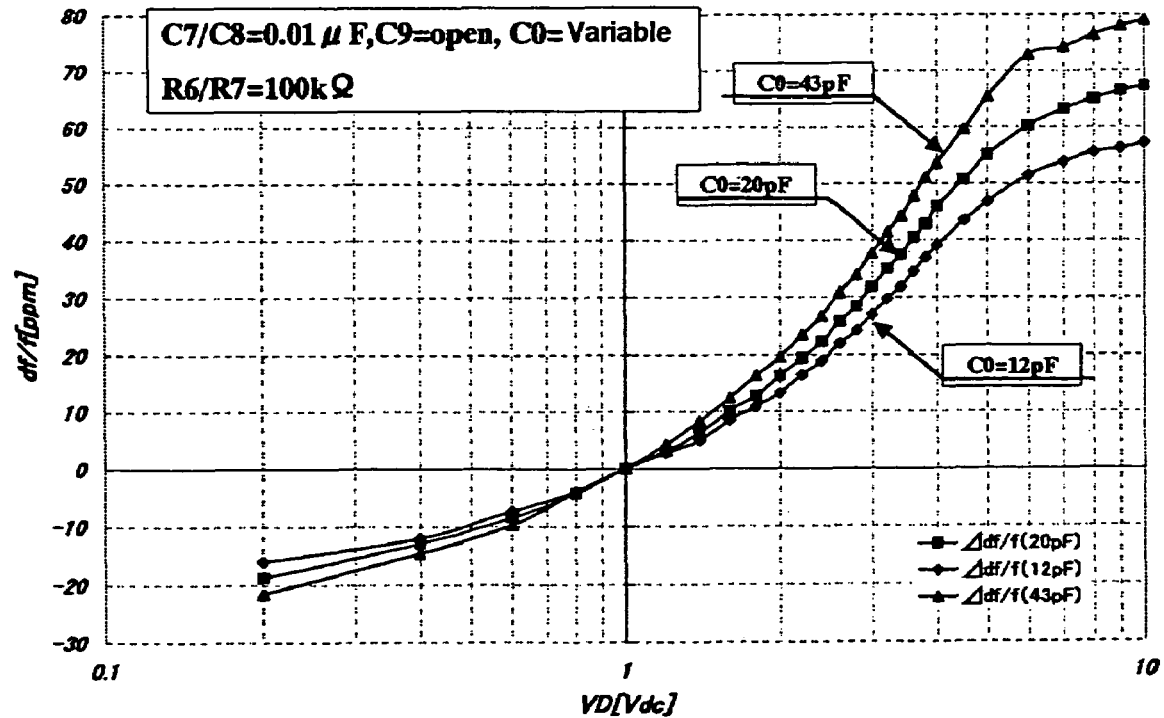
FIG. 8 illustrates a circuit example 5 expressing a relationship between D1 application voltage and frequency deviation according to the present invention.

FIG. 8 illustrates a frequency deviation having each $C_o$ as a parameter relative to a change in the voltage of the VD. From FIG. 8, it is clear that the change quantity is slightly different depending on the value of $C_o$.

Figure 9:
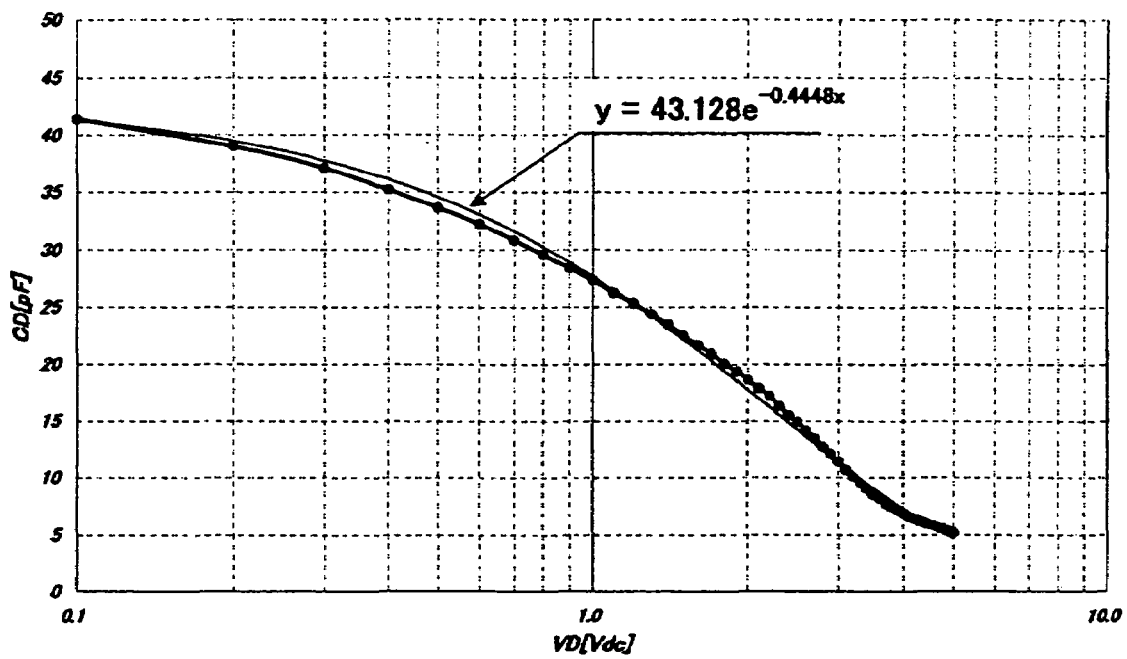
FIG. 9 illustrates a relationship between measuring results of a variable capacitance diode D1: MA2S304 and approximation function according to the present invention.

FIG. 9 illustrates a relationship between a voltage applied to the variable capacitance diode D1: MA2S304 and capacitance change characteristics. FIG. 9 illustrates measured data and approximation function. From FIG. 9, it is clear that the measured data coincides well with the approximation function.

Figure 10:
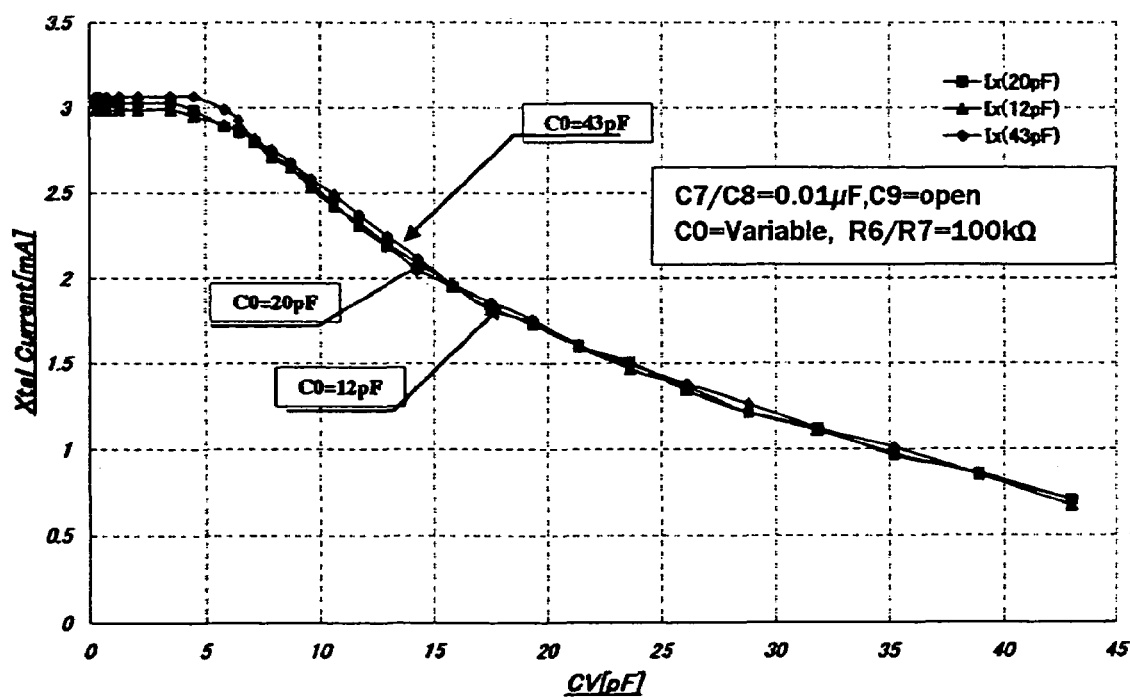
FIG. 10 illustrates a circuit example 6 expressing a relationship between D1 variable capacitance and vibrator current according to the present invention.

FIG. 10 illustrates a vibrator current versus capacitance change of the variable capacitance diode D1. From FIG. 10, it is clear that the vibrator current is not substantially affected by a change of the capacitance $C_o$.

Figure 11:
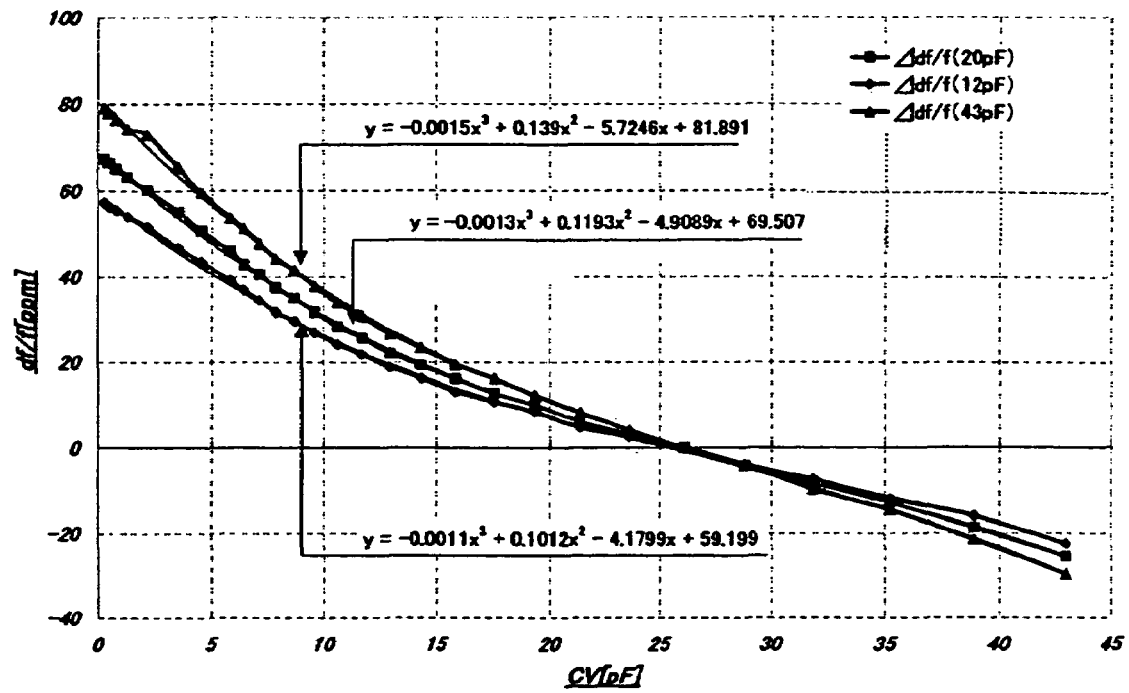
FIG. 11 illustrates a circuit example 7 expressing a relationship between D1 variable capacitance and frequency deviation according to the present invention.

FIG. 11 illustrates a frequency deviation versus capacitance change of the variable capacitance diode D1, based on a reference where VD=1 Vdc, and CV=26 pF. FIG. 11 illustrates approximation function using each $C_o$ as a parameter.

Figure 12:
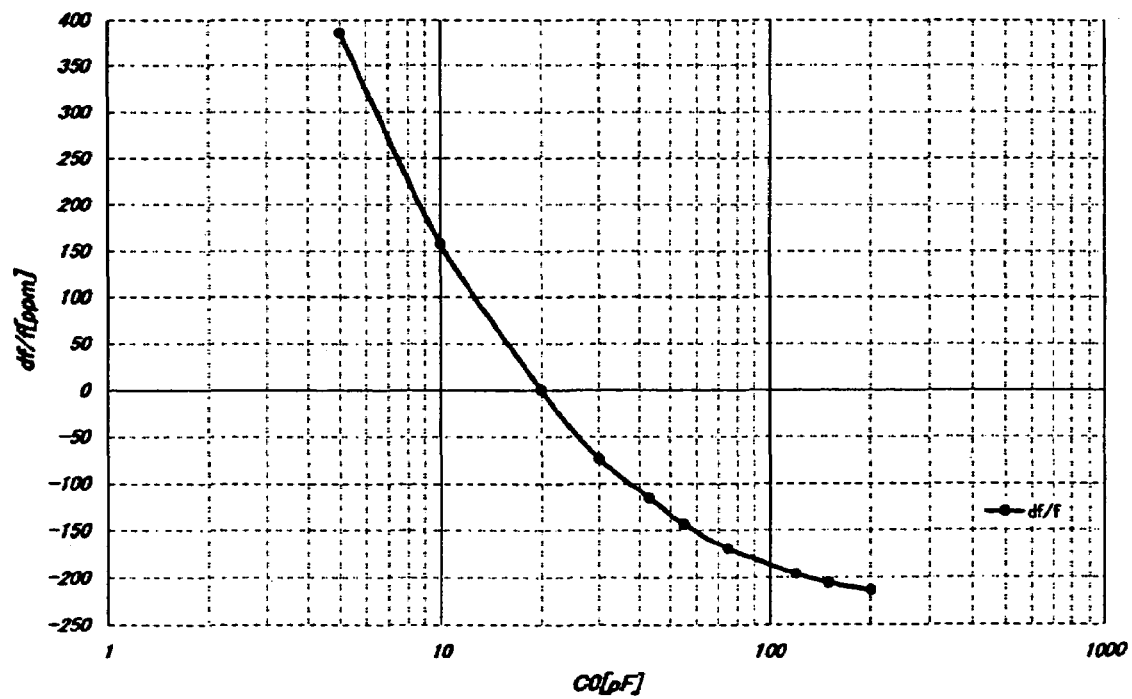
FIG. 12 illustrates a circuit example 8 expressing a relationship between $C_o$ variable capacitance and frequency deviation according to the present invention.

FIG. 12 illustrates a change in the oscillation frequency when the capacitance $C_o$ is variable. $C_o$=20 pF is a reference. The capacitance of the D1 is set as follows. VD=1 Vdc, that is, CV=26 pF. As a result, when $C_o$ is changed from 12 pF to 43 pF, a change of about 280 ppm is obtained as a frequency deviation.

Figure 13:
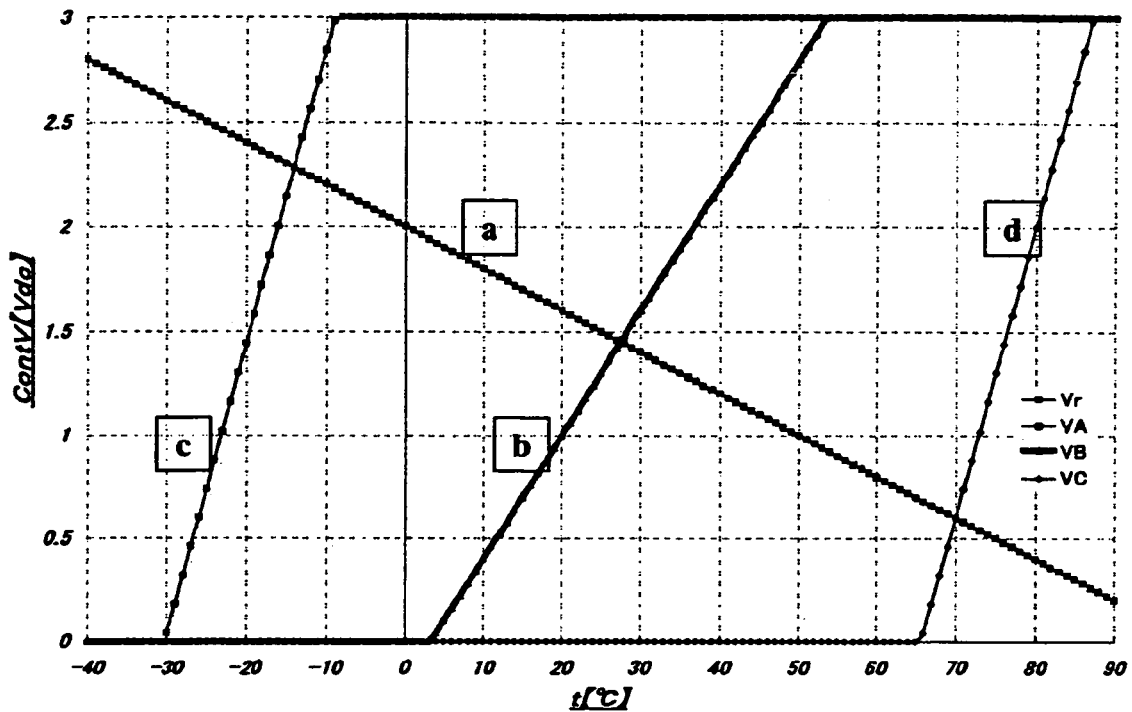
FIG. 13 illustrates a circuit example 9 expressing a simulation result 1 of a temperature compensation voltage generation circuit according to the present invention.

FIG. 13 illustrates a result of a simulation carried out using the circuit constants. In FIG. 13, each symbol represents a voltage change of a portion of each respective symbol in FIG. 3.

[a] represents a monotonous decrease relative to the temperature change in the output from the operation amplifier IC1.

[b] represents a monotonous increase from near 0° C. to near 50° C. to compensate for a change in the vicinity of an inflection point of the vibrator in the output from an operation amplifier IC2.

[c] represents a monotonous increase from near −30° C. to near −10° C. to compensate for a low temperature side of the vibrator in the output from an operation amplifier IC3.

[d] represents a monotonous increase from near 65° C. to near 90° C. to compensate for a high temperature side of the vibrator in the output from an operation amplifier IC4.

Figure 14:
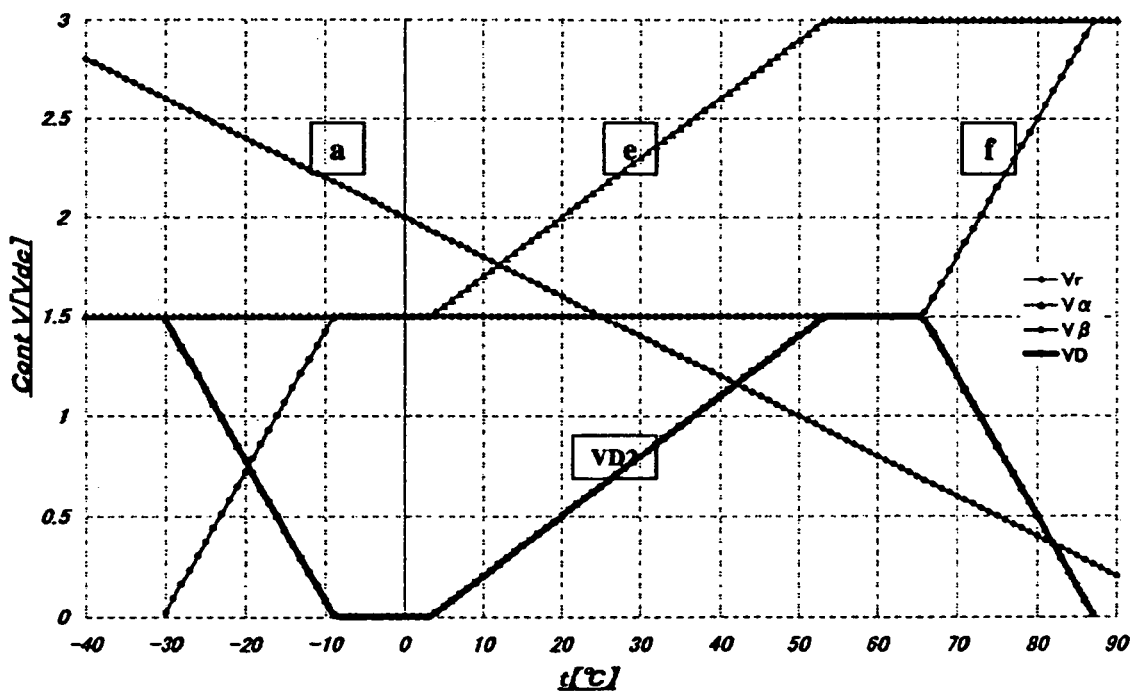
FIG. 14 illustrates a circuit example 10 expressing a simulation result 2 of a temperature compensation voltage generation circuit according to the present invention.

FIG. 14 illustrates a voltage change at each portion of the temperature compensation voltage generation circuit 15 shown in FIG. 3. [e] represents a voltage change based on a combination of [b] and Vcc. [f] represents a voltage change based on a combination of [c] and [d]. [VD] represents a change in the voltage between the cathode and the anode of the variable capacitance diode.

Figure 15:
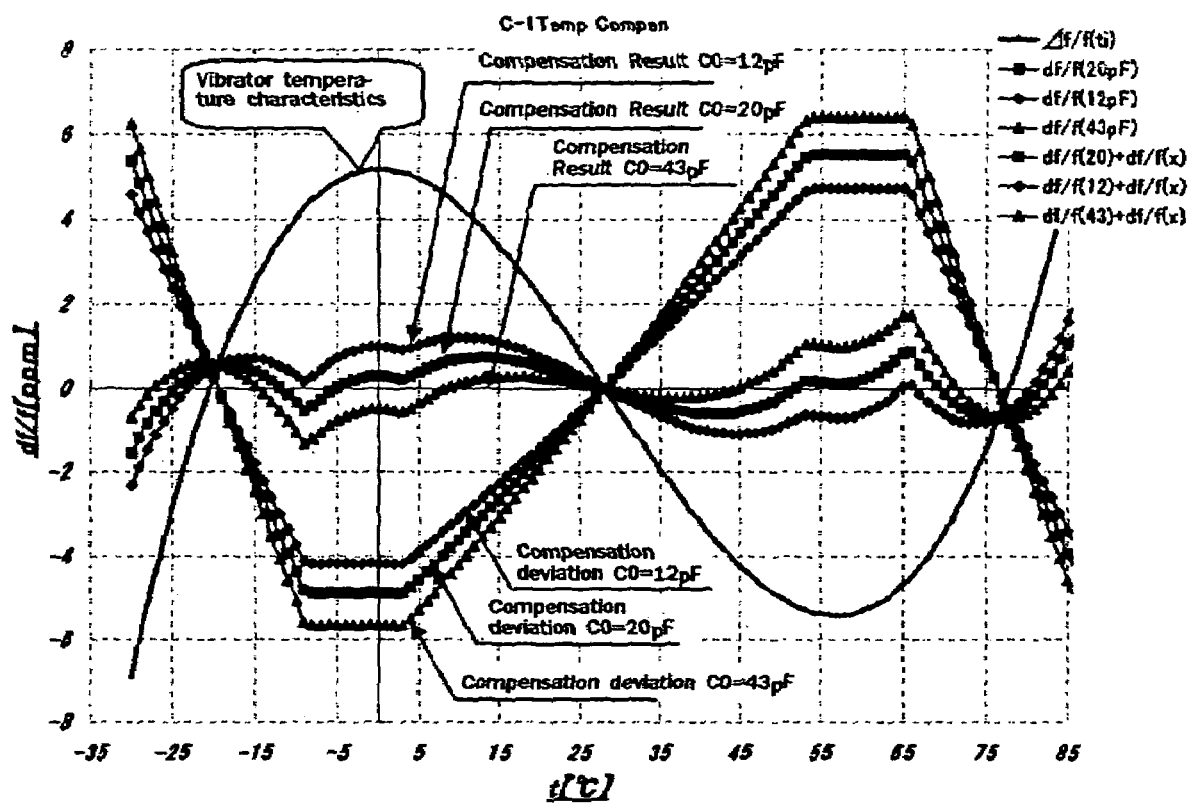
FIG. 15 illustrates a circuit example 11 expressing a simulation result of vibrator temperature characteristics, temperature compensation frequency deviation, and compensation according to the present invention.

FIG. 15 illustrates a result of carrying out a temperature compensation simulation according to an oscillation frequency deviation due to a change in the variable capacitance diode D1 that controls the vibrator current based on FIG. 11.

In other words, the variable capacitance diode D1 that controls the vibrator current receives a compensation voltage from the temperature compensation voltage generation circuit 15, thereby to change the capacitance of the vibrator current control circuit 13. From FIG. 11, parallel capacitances C7, C8, and C9 are set to properly compensate for the temperature characteristics of the vibrator based on a relational expression of the capacitance change versus frequency deviation using $C_o$ as a parameter. The temperature compensation simulation is carried out based on the following setting. 1. $C_o$=20 pF, C7=5 pF, and C8/C9=66 pF. As a result of the simulation, the temperature characteristics ±2 ppm or less are obtained within a temperature range from −30° C.~±85° C.

2. Based on the above setting, that is, "C7=5 pF, and C8/C9=66 pF", $C_o$ is changed to $C_o$=12 pF and $C_o$=43 pF. As a result, when $C_o$=12 pF, the frequency rises by about 0.8 ppm in the vicinity of 0° C., and the frequency falls by about 0.8 ppm in the vicinity of 55° C. When $C_o$=43 pF, the frequency falls by about 1 ppm in the vicinity of 0° C., and the frequency rises by about 1 ppm in the vicinity of 55° C.

From the result of the $C_o$ versus frequency deviation shown in FIG. 12, it is clear that when the load capacitance of $C_o$ is changed from 20 pF to 12 pF, the frequency rises by 150 ppm, and when the load capacitance of $C_o$ is changed from 20 pF to 43 pF, the frequency falls by 130 ppm.

In other words, these frequency changes cannot be obtained based on the temperature compensation and external variable control according to the conventional load capacitance change method only.

Figure 16:
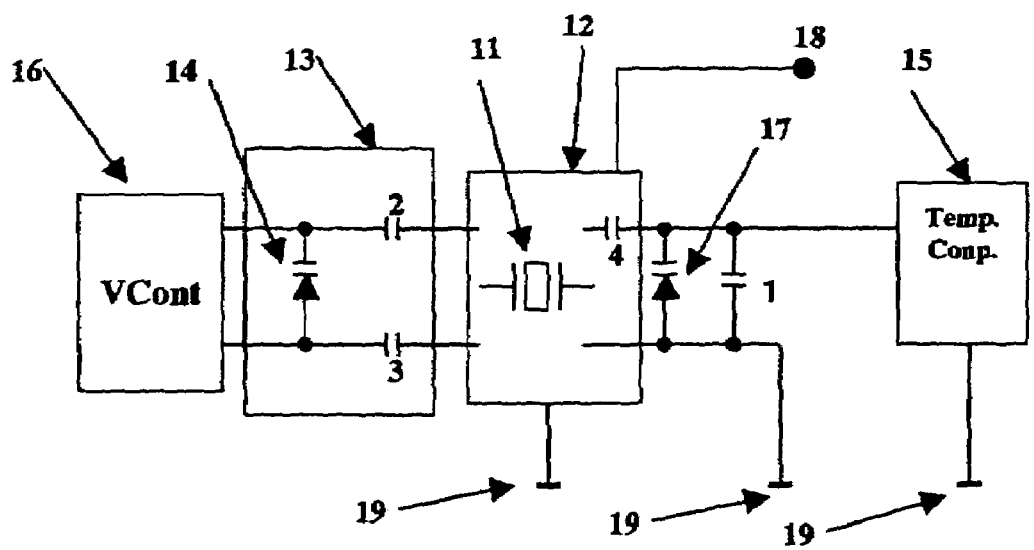
FIG. 16 is a block diagram of another example of a temperature compensation system according to the present invention.

FIG. 16 is a block diagram illustrating another example of the temperature compensation system according to the present invention. Like constituent elements are designated with like reference numerals, and a duplicated explanation will be omitted. FIG. 16 is different from FIG. 1 in that the positions of the temperature compensation voltage generation circuit 15 and the external variable voltage controller 16 are different. In other words, the external variable voltage controller 16 controls the vibrator current control circuit 13, and the temperature compensation voltage generation circuit 15 changes the capacitance of the variable capacitance diode 17 to compensate for temperature.

As explained above, according to the present invention, the vibrator current is controlled to change the frequency to compensate for the temperature characteristics of the crystal vibrator. When the frequency needs to be changed according to an external control, the load capacitance is changed according to the conventional method.

With the above arrangement, mutual interference is not present, and particularly, frequency can be changed significant based on the external variable voltage control. As there is less interference to the temperature compensation quantity due to the external variable voltage control, excellent temperature characteristics can also be obtained. This is expected to make a large contribution to the future functional expansion of the crystal oscillator and the piezoelectric oscillator.

Figure 17:
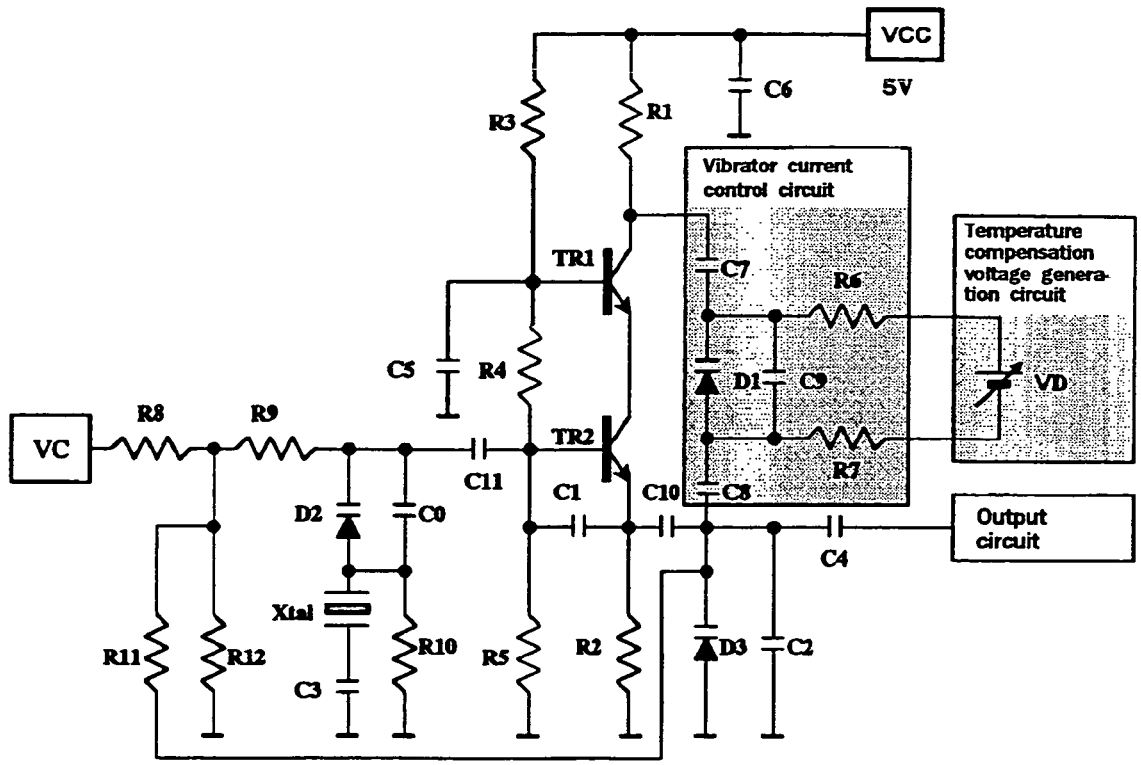
FIG. 17 illustrates an example of a distortion correction circuit of a temperature compensation system.

FIG. 17 illustrates a circuit that corrects a difference in frequency deviation (compensation distortion due to a load capacitance change) based on a voltage application to the variable capacitance diode D1 that controls the vibrator current according to the value of the load capacitance shown in FIG. 8. The control quantity of the vibrator current control system according to the present invention is determined based on the ratio of collector-emitter capacitance to the emitter-GND capacitance. The control quantity becomes larger when the emitter-GND capacitance is smaller than the collector-emitter capacitance.

Based on the above fact, the external voltage Vc is changed to control the variable reactance element (i.e., variable capacitance diode D2) thereby to change the load capacitance to change the frequency. At the same time, the variable reactance element (i.e., variable capacitance diode D3) is inserted into between the emitter and the GND, and the external voltage Vc is applied to change the capacitance of the diode. With the above arrangement, the compensation distortion due to the change in the load capacitance following the control of the variable capacitance diode D2 can be corrected. In this case, the load capacitance is made small to change the frequency to be high, and the capacitance between the emitter and the GND is made small to increase the compensation quantity thereby to correct the distortion. This further makes smaller the load capacitance. The fact that the distortion correction control and the frequency change control can be carried out at the same time has a large effect.

Figure 18:
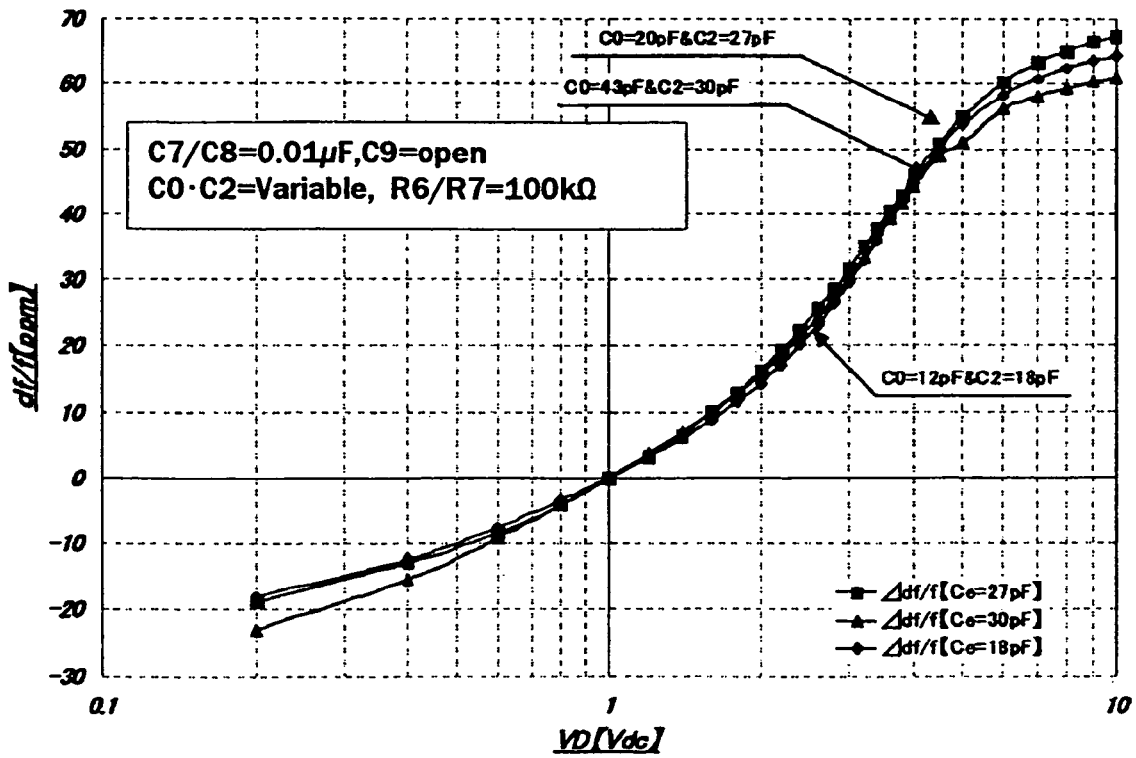
FIG. 18 illustrates a circuit example 12 expressing a relationship between D1 application voltage and frequency deviation of a circuit (having a distortion correction circuit) according to the present invention.

FIG. 18 illustrates a result of carrying out the measurement by taking the following measure to the capacitor $C_o$ that is connected to in series with the vibrator.

$C_o$=20 pF . . . emitter-GND capacitance: C2=27 pF is the basis. Distortion correction control is carried out based on $C_o$=12 pF . . . emitter-GND capacitance: C2=18 pF, $C_o$=43 pF . . . emitter-GND capacitance: C2=30 pF. FIG. 18 illustrates a frequency deviation due to the voltage application to the variable capacitance diode D1 that controls the vibrator current.

Based on the result of FIG. 8 before the correction, the difference (distortion value)=about 8 ppm relative to VD=2 Vdc before the correction. The difference (distortion value) =about 2 ppm relative to VD=2 Vdc after the correction. This becomes the improvement from the distortion (dependency of the capacitance $C_o$ in the D1 application voltage versus frequency deviation characteristics).

Figure 19:
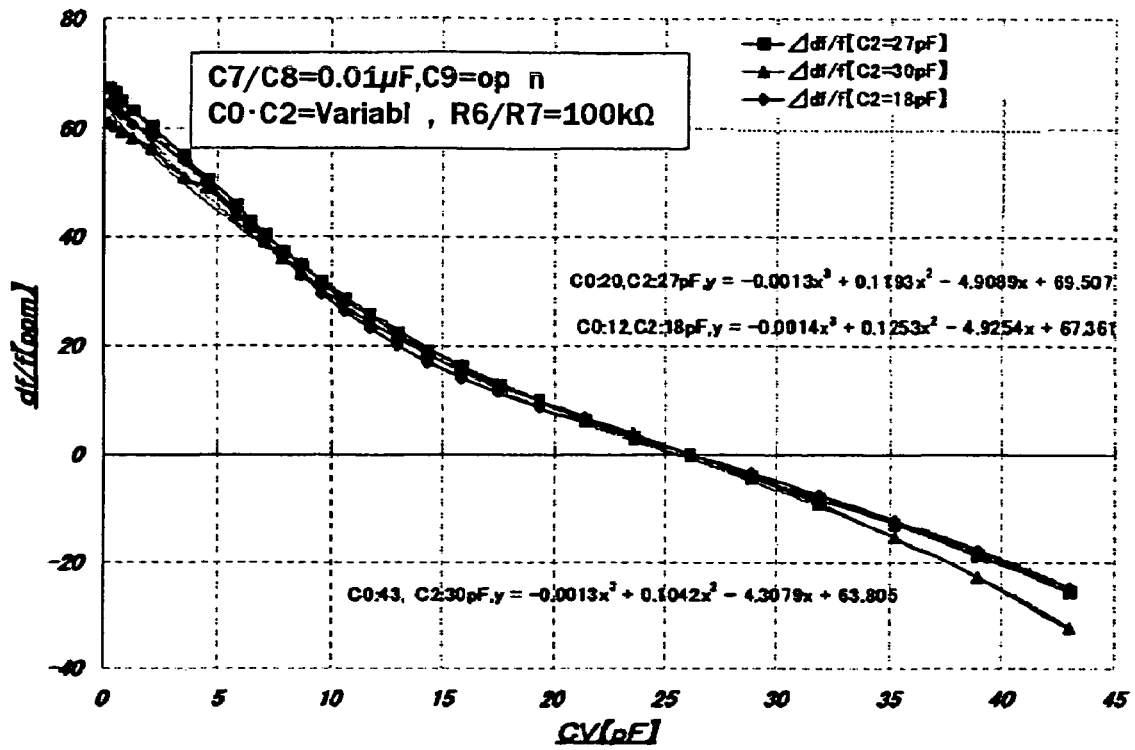
FIG. 19 illustrates a circuit example 13 expressing a relationship between D1 variable capacitance and frequency deviation of a circuit (having a distortion correction circuit) according to the present invention.

FIG. 19 illustrates a relationship between the capacitance change of the variable capacitance diode D1 that controls the vibrator current and the frequency deviation when the distortion is corrected.

Figure 20:
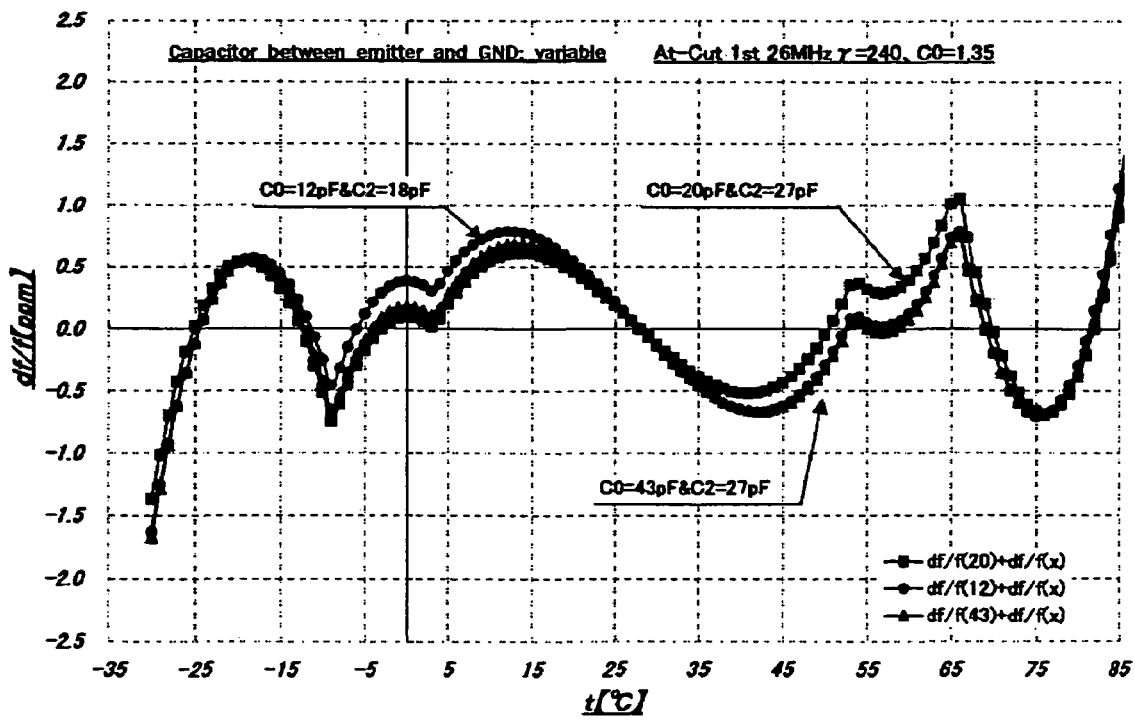
FIG. 20 illustrates a circuit example 14 expressing a simulation result of temperature compensation of a circuit (having a distortion correction circuit) according to the present invention.

FIG. 20 illustrates a simulation result of temperature characteristics when the correction distortion is carried out.

Figure 21:
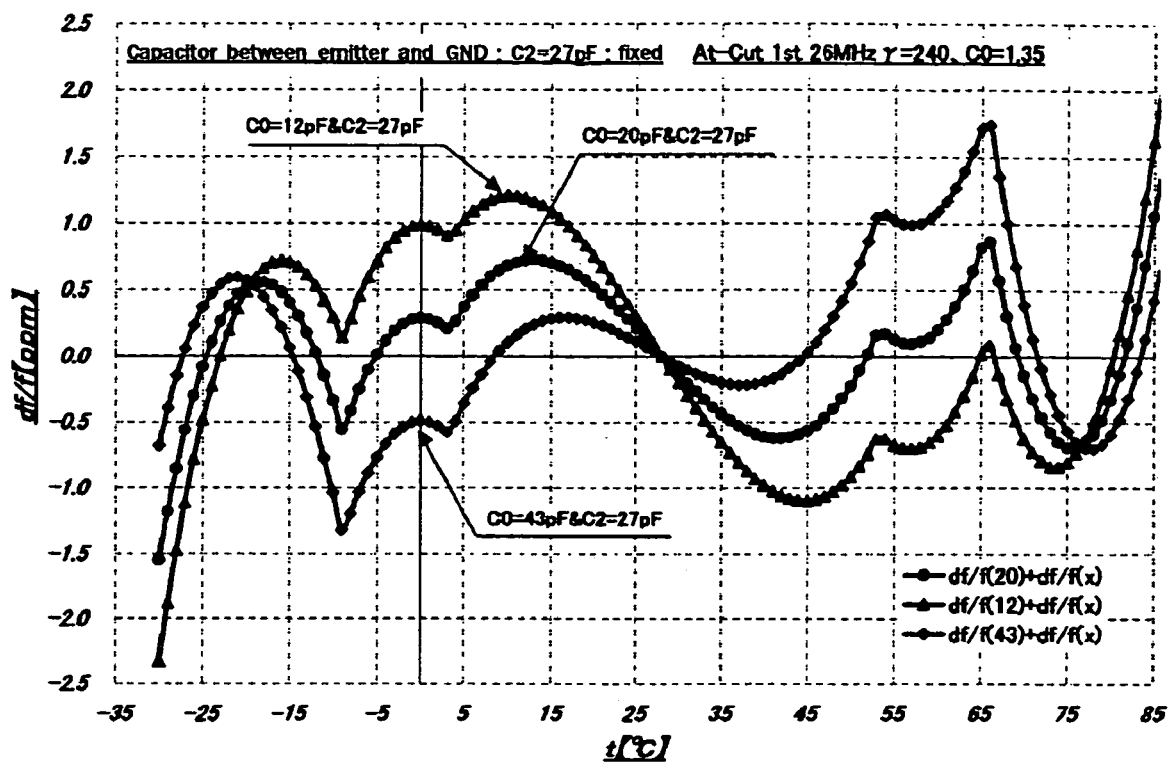
FIG. 21 illustrates a circuit example 15 expressing a simulation result of temperature compensation of a circuit according to the present invention.
Figure 22:
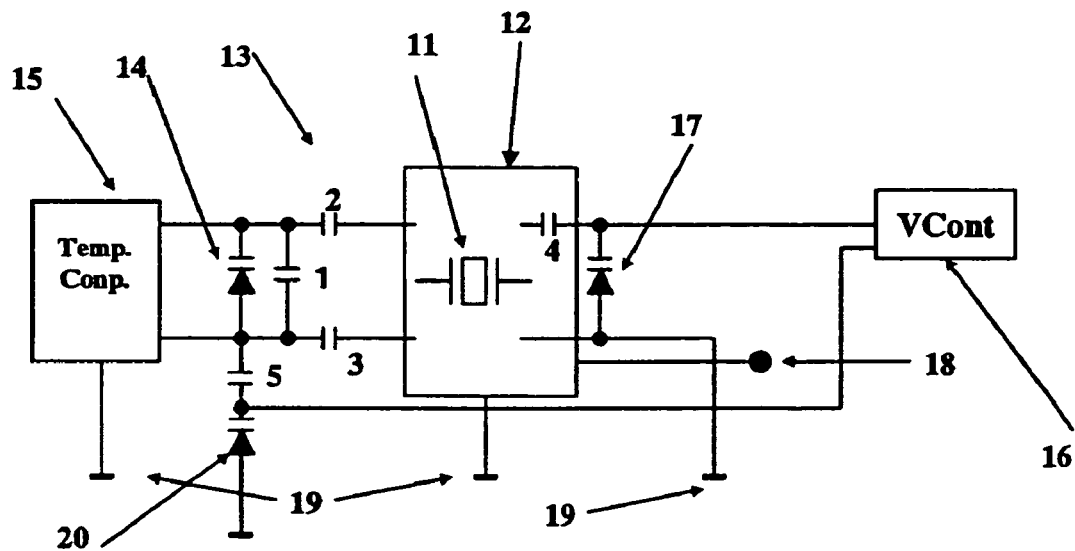
FIG. 22 is a block diagram of a temperature compensation system (having a distortion correction circuit) according to the present invention.
Figure 23:
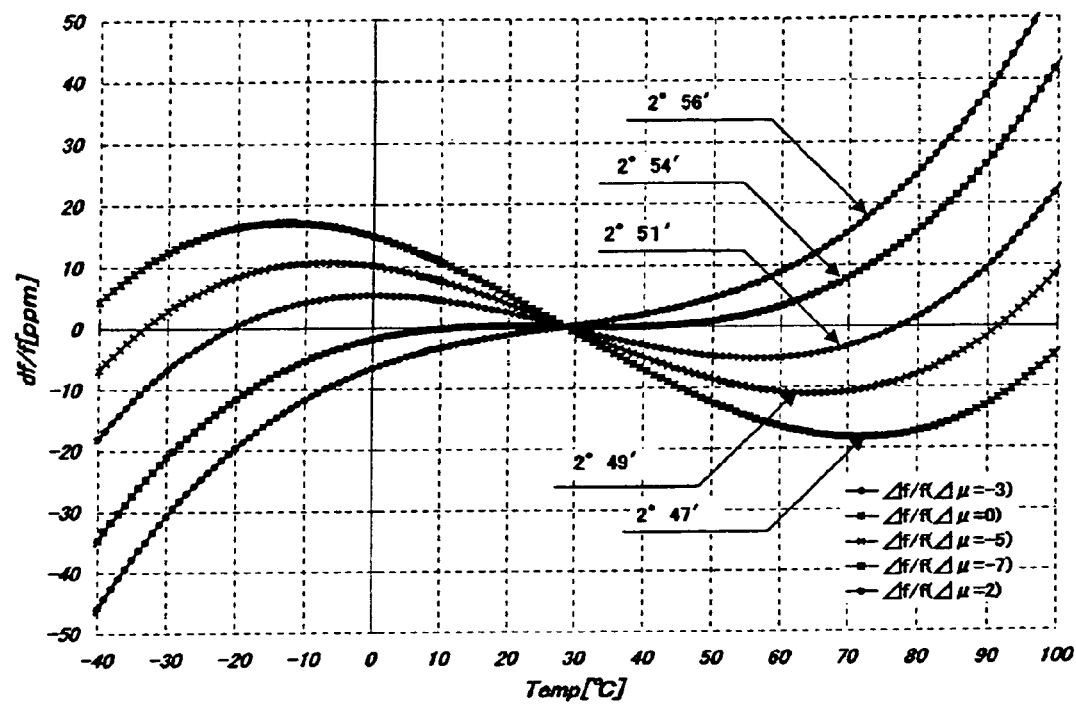
FIG. 23 illustrates a simulation result of temperature characteristics due to difference in cutting angle of an At-Cut vibrator.
Figure 24:
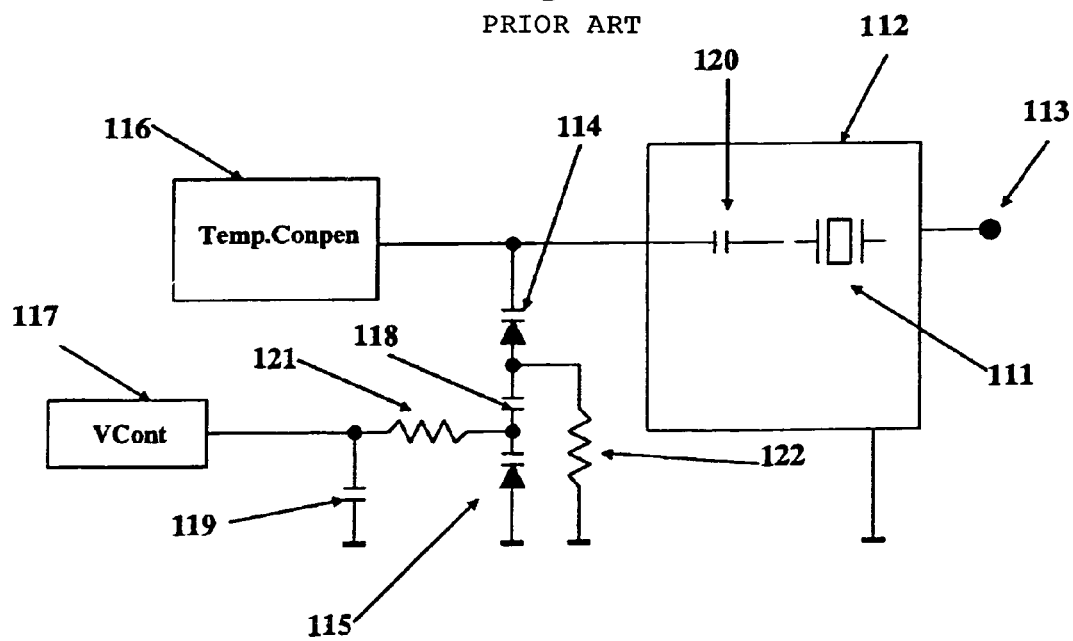
FIG. 24 is a block diagram of a conventional temperature compensation system.
Figure 25:
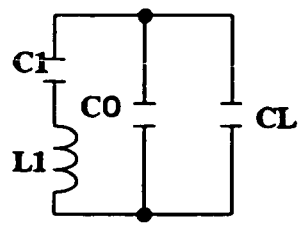
FIG. 25 illustrates a resonance frequency equivalent block diagram 1.
Figure 26:
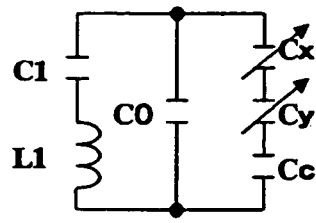
FIG. 26 illustrates a resonance frequency equivalent block diagram 2.
Figure 27:
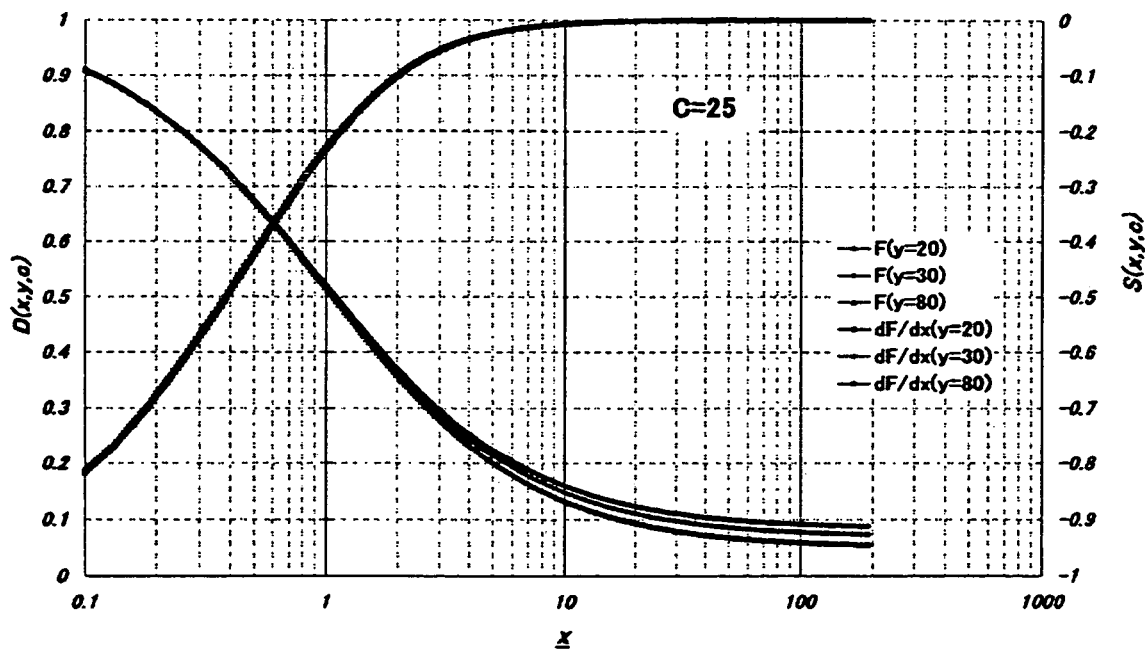
FIG. 27 illustrates a simulation diagram of F(x, y, c) and $S_x$.
Figure 30:
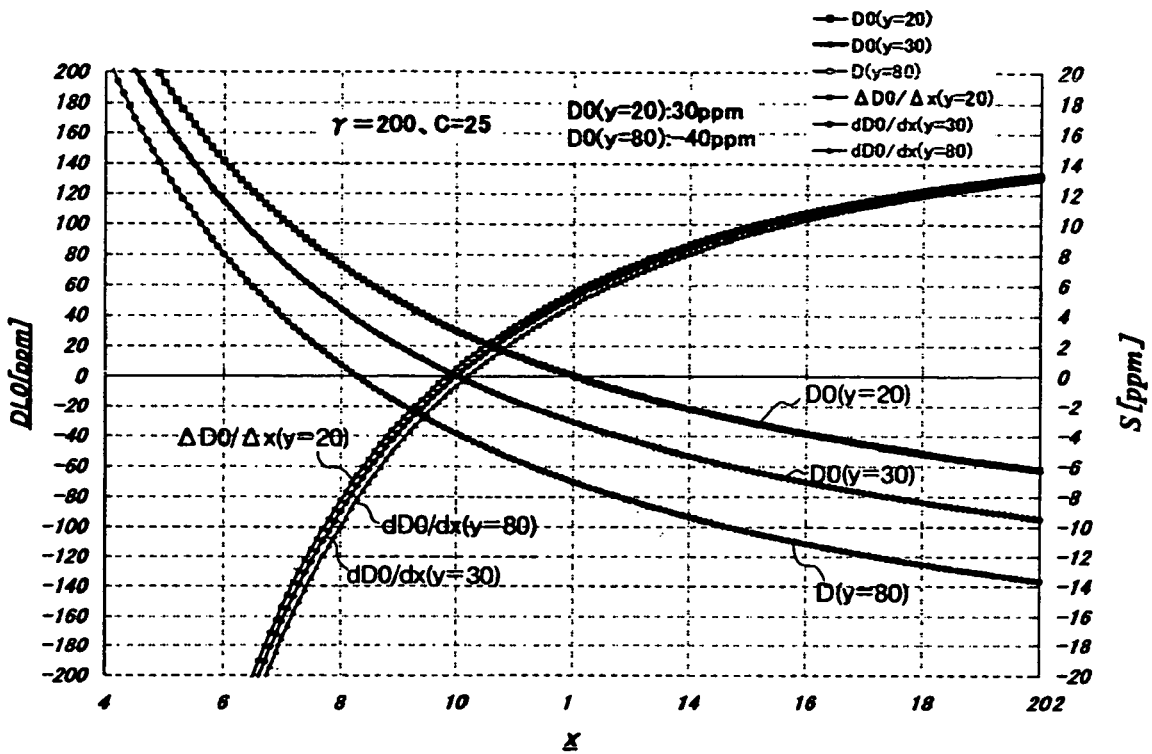
FIG. 30 illustrates a simulation diagram of D(x, y, c) and $S_x$.
Figure 31:
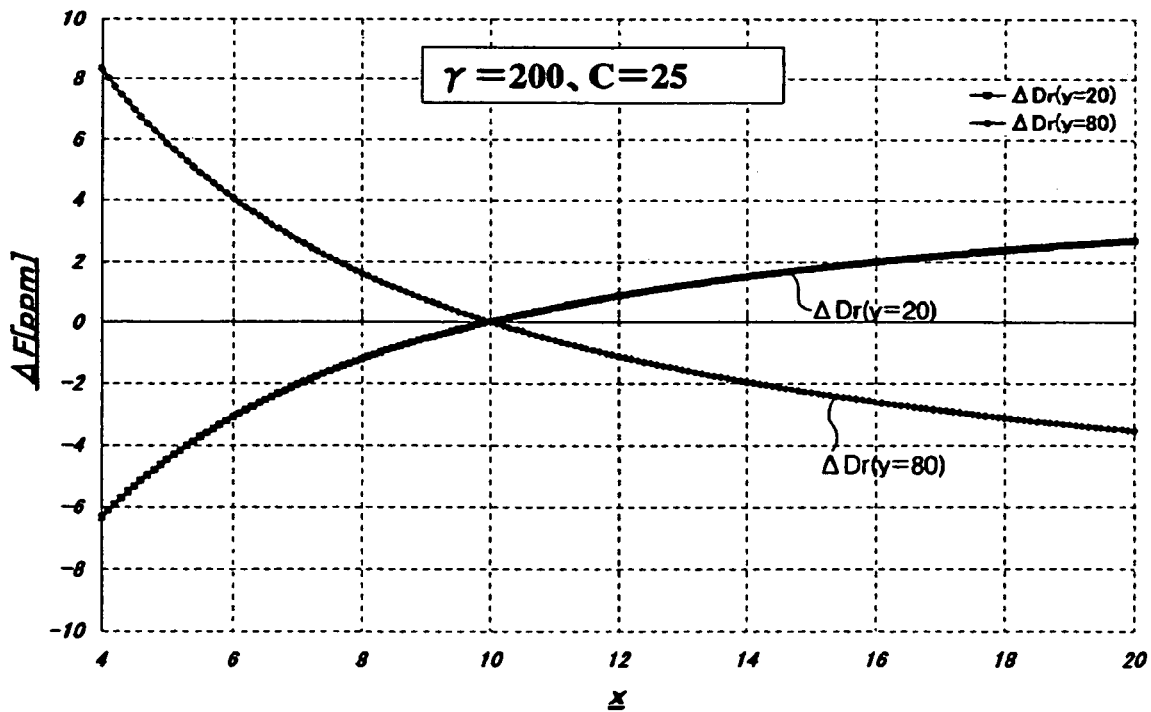
FIG. 31 illustrates a simulation diagram of ΔF(x, y, c)
Figure 32:
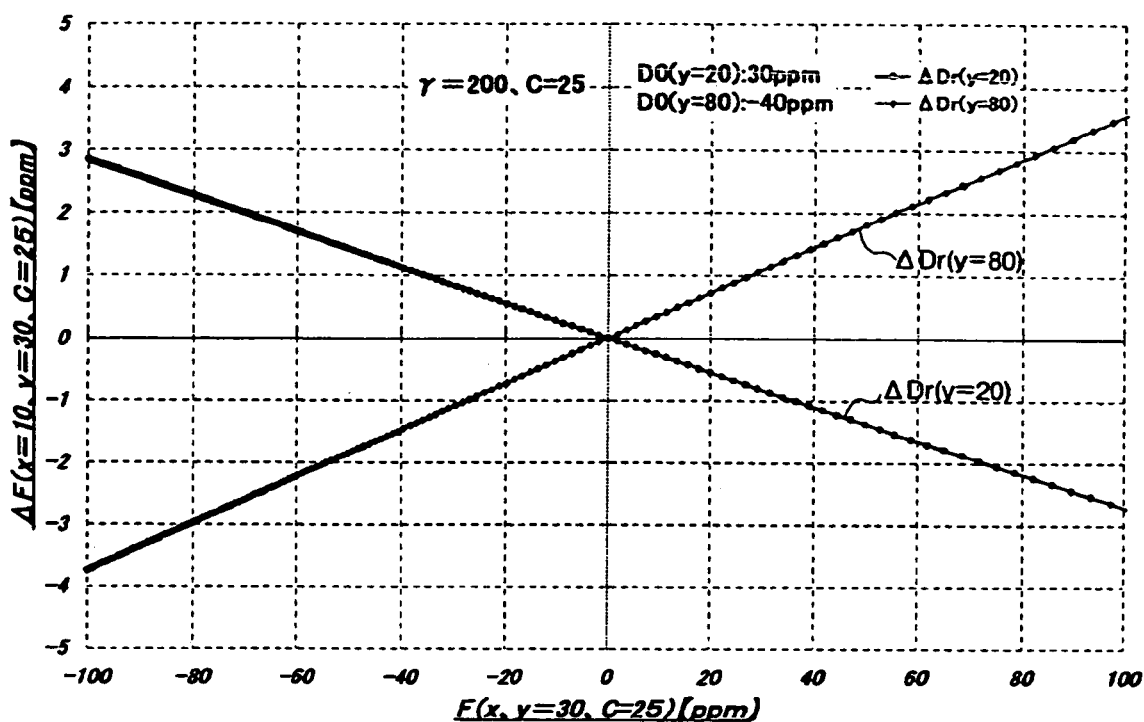
FIG. 32 illustrates a simulation diagram of ΔF(x, y, c) and F.

FIG. 21 illustrates a result of the temperature characteristics simulation shown in FIG. 15, that is, before the distortion correction.

From the above results, it is clear that when the distortion quantity is about 1.6 ppm before the correction, the distortion is corrected to about 0.4 ppm by carrying out a correction, which is about one quarter of the distortion.

As explained above, according to the first aspect of the present invention, the vibrator current is controlled to compensate for the temperature characteristics. Therefore, an oscillator having two or more load capacitance variable functions can obtain a large variable range, and at the same time, can obtain high temperature stability without interfering with the mutual variable ranges.

According to the second aspect of the invention, the effect similar to that obtained from the first aspect of the invention can be obtained.

According to the third aspect of the invention, as a reactance element that changes the oscillation frequency is further inserted, the oscillation frequency can be changed in a simple circuit configuration.

According to the fourth aspect of the invention, the variable reactance element is used that can optionally change the reactance element like a variable trimmer. Therefore, the oscillation frequency can be easily controlled externally.

According to the fifth aspect of the invention, the vibrator current controller comprises the correction variable capacitance diode. Therefore, it is possible to correct the compensation distortion generated by changing the load capacitance, thereby to further decrease the frequency distortion relative to the application voltage.

What is claimed is:

1. A temperature compensated crystal oscillator comprising: a oscillation circuit that has a piezoelectric vibrator having a piezoelectric element which is excited in a predetermined frequency, and an oscillation amplifier that excites the piezoelectric element by flowing a current to the piezoelectric element; a vibrator current controller that controls a current of the piezoelectric vibrator; a temperature compensation circuit that compensates for temperature characteristics of the piezoelectric vibrator; and a variable capacitance diode that changes the oscillation frequency by changing the load capacitance of the oscillation circuit using an external voltage, wherein the temperature compensation circuit generates a functional voltage that compensates for the temperature characteristics of the piezoelectric vibrator, and inputs the functional voltage to the vibrator current controller, thereby to control the vibrator current to change the oscillation frequency of the oscillation circuit so as to compensate for the temperature characteristics of the piezoelectric vibrator, and the temperature compensation circuit changes an application voltage of the variable capacitance diode using the external voltage, thereby to change the oscillation frequency of the oscillation circuit.

2. A temperature compensated crystal oscillator comprising: a oscillation circuit that has a piezoelectric vibrator having a piezoelectric element which is excited in a predetermined frequency, and an oscillation amplifier that excites the piezoelectric element by flowing a current to the piezoelectric element; a vibrator current controller that controls a current of the piezoelectric vibrator; a temperature compensation circuit that compensates for temperature characteristics of the piezoelectric vibrator; and a variable capacitance diode that changes the oscillation frequency by changing the load capacitance of the oscillation circuit using an external voltage, wherein the temperature compensation circuit generates a functional voltage that compensates for the temperature characteristics of the piezoelectric vibrator, and applies the functional voltage to the variable capacitance diode to change the load capacitance of the oscillation circuit, thereby to change the oscillation frequency of the oscillation circuit so as to compensate for the temperature characteristics of the piezoelectric vibrator, and the temperature compensation circuit changes a voltage to be input to the vibrator current controller using the external voltage, thereby to change the oscillation frequency of the oscillation circuit.

3. The temperature compensated crystal oscillator according to claim 1 or 2, wherein
a reactance element that changes the oscillation frequency of the oscillation circuit by changing the load capacitance is further inserted into the load of the oscillation circuit.

4. The temperature compensated crystal oscillator according to claim 1 or 2, wherein
a variable reactance element that changes the oscillation frequency of the oscillation circuit by changing the load capacitance is further inserted into the load of the oscillation circuit, and the capacitance of the variable reactance element is changed from the outside of the oscillator thereby to control the oscillation frequency of the oscillation circuit.

5. The temperature compensated crystal oscillator according to claim 1, further comprising:
a correction variable capacitance diode that corrects a compensation distortion generated by changing the load capacitance, wherein
the correction variable capacitance diode corrects a compensation distortion generated by changing the load capacitance of the vibrator current controller using a functional voltage that is generated by the temperature compensation circuit.

* * * * *